(12) United States Patent
Heo et al.

(10) Patent No.: US 12,202,231 B2
(45) Date of Patent: Jan. 21, 2025

(54) PLASTIC SUBSTRATE WITH IMPROVED HARDNESS AND DISPLAY DEVICE INCLUDING THE SAME

(71) Applicant: Samsung Display Co., Ltd., Yongin-si (KR)

(72) Inventors: Jinnyoung Heo, Asan-si (KR); Hwajin Oh, Seoul (KR); Hyemin Seo, Suwon-si (KR); Sungguk An, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/953,137

(22) Filed: Sep. 26, 2022

(65) Prior Publication Data

US 2023/0051952 A1   Feb. 16, 2023

Related U.S. Application Data

(62) Division of application No. 15/647,010, filed on Jul. 11, 2017, now abandoned.

(30) Foreign Application Priority Data

Jul. 11, 2016   (KR) .................. 10-2016-0087605

(51) Int. Cl.
*B32B 27/06*   (2006.01)
*B32B 3/08*   (2006.01)
(Continued)

(52) U.S. Cl.
CPC ............... *B32B 27/06* (2013.01); *B32B 3/08* (2013.01); *B32B 7/12* (2013.01); *B32B 9/005* (2013.01);
(Continued)

(58) Field of Classification Search
None
See application file for complete search history.

(56) References Cited

U.S. PATENT DOCUMENTS 7,102,161 B2   9/2006   Inukai
7,393,581 B2   7/2008   Kim et al.
(Continued)

FOREIGN PATENT DOCUMENTS

CN   1918002 A   2/2007
JP   09113943 A *   5/1997
(Continued)

OTHER PUBLICATIONS

Shintaro Nasu JI of Colloid and Interface Science 348 pp. 446-451 (2010).*

(Continued)

*Primary Examiner* — John Vincent Lawler
(74) *Attorney, Agent, or Firm* — Lewis Roca Rothgerber Christie LLP

(57) ABSTRACT

A plastic substrate includes: a plastic support member having light transmittance; and a first organic-inorganic hybrid layer on the plastic support member. The first organic-inorganic hybrid layer includes: a first organic-inorganic hybrid matrix; and ions implanted into the first organic-inorganic hybrid matrix at a side opposite to a side adjacent the plastic support member. An amount of the ions per unit area is in a range from about $2 \times 10^{13}/cm^2$ to about $2 \times 10^{14}/cm^2$.

7 Claims, 12 Drawing Sheets

(51) Int. Cl.

| | |
|---|---|
| *B32B 7/12* | (2006.01) |
| *B32B 9/00* | (2006.01) |
| *B32B 9/04* | (2006.01) |
| *B32B 15/04* | (2006.01) |
| *B32B 15/18* | (2006.01) |
| *B32B 23/04* | (2006.01) |
| *B32B 23/08* | (2006.01) |
| *B32B 27/08* | (2006.01) |
| *B32B 27/28* | (2006.01) |
| *B32B 27/30* | (2006.01) |
| *B32B 27/32* | (2006.01) |
| *B32B 27/34* | (2006.01) |
| *B32B 27/36* | (2006.01) |
| *G02F 1/1333* | (2006.01) |
| *G06F 3/0354* | (2013.01) |
| *G06F 3/038* | (2013.01) |
| *G06F 3/041* | (2006.01) |
| *G06F 3/044* | (2006.01) |
| *H10K 50/844* | (2023.01) |
| *H10K 50/84* | (2023.01) |
| *H10K 59/12* | (2023.01) |
| *H10K 71/00* | (2023.01) |
| *H10K 77/10* | (2023.01) |
| *H10K 102/00* | (2023.01) |

(52) U.S. Cl.
CPC .............. *B32B 9/041* (2013.01); *B32B 9/045* (2013.01); *B32B 15/04* (2013.01); *B32B 15/18* (2013.01); *B32B 23/04* (2013.01); *B32B 23/08* (2013.01); *B32B 27/08* (2013.01); *B32B 27/28* (2013.01); *B32B 27/281* (2013.01); *B32B 27/302* (2013.01); *B32B 27/32* (2013.01); *B32B 27/34* (2013.01); *B32B 27/36* (2013.01); *B32B 27/365* (2013.01); *G02F 1/133305* (2013.01); *G06F 3/03545* (2013.01); *G06F 3/0383* (2013.01); *G06F 3/04162* (2019.05); *G06F 3/0442* (2019.05); *G06F 3/0445* (2019.05); *G06F 3/0446* (2019.05); *H10K 50/8445* (2023.02); *B32B 2255/10* (2013.01); *B32B 2255/20* (2013.01); *B32B 2255/24* (2013.01); *B32B 2255/28* (2013.01); *B32B 2270/00* (2013.01); *B32B 2307/4026* (2013.01); *B32B 2307/536* (2013.01); *B32B 2307/554* (2013.01); *B32B 2307/732* (2013.01); *B32B 2383/00* (2013.01); *B32B 2457/20* (2013.01); *B32B 2457/206* (2013.01); *G02F 1/133302* (2021.01); *G02F 2202/02* (2013.01); *G02F 2202/09* (2013.01); *G06F 2203/04111* (2013.01); *G06F 2203/04112* (2013.01); *H10K 50/841* (2023.02); *H10K 59/12* (2023.02); *H10K 71/00* (2023.02); *H10K 77/111* (2023.02); *H10K 2102/311* (2023.02)

(56) References Cited

U.S. PATENT DOCUMENTS

| | | | |
|---|---|---|---|
| 2003/0121644 | A1 | 7/2003 | Tonosaki et al. |
| 2004/0024106 | A1 | 2/2004 | Kim |
| 2005/0175831 | A1* | 8/2005 | Kim .................. G02F 1/133345 428/323 |
| 2007/0267135 | A1 | 11/2007 | Kim et al. |
| 2008/0012850 | A1* | 1/2008 | Keating, III ......... H04N 13/254 348/E13.016 |
| 2008/0296510 | A1 | 12/2008 | Kasama et al. |
| 2013/0134550 | A1* | 5/2013 | Tanaka .............. H01L 21/76237 257/526 |
| 2014/0248472 | A1 | 9/2014 | Memering et al. |
| 2014/0295158 | A1* | 10/2014 | Oh ........................ B32B 27/308 428/215 |
| 2014/0308494 | A1 | 10/2014 | Iwaya et al. |
| 2015/0287954 | A1 | 10/2015 | Naganawa et al. |
| 2016/0027718 | A1* | 1/2016 | Park .................. G02F 1/133385 165/80.3 |
| 2017/0243737 | A1* | 8/2017 | Tanigaki ................ G03F 7/423 |
| 2017/0253965 | A1 | 9/2017 | Takada et al. |
| 2017/0309677 | A1 | 10/2017 | Kuroki et al. |

FOREIGN PATENT DOCUMENTS

| | | |
|---|---|---|
| JP | H 09113943 A | 5/1997 |
| JP | 2003-151988 A | 5/2003 |
| JP | 2004-128374 A | 4/2004 |
| JP | 2008-204683 A | 9/2008 |
| KR | 2001-0086865 A | 9/2001 |
| KR | 2002-0077988 A | 10/2002 |
| KR | 10-2004-0017621 A | 2/2004 |
| KR | 10-2006-0041696 A | 5/2006 |
| KR | 10-2006-0083191 A | 7/2006 |
| KR | 10-2014-0119860 A | 10/2014 |
| KR | 10-2016-0020696 A | 2/2016 |
| WO | WO 2015/146749 A1 | 10/2015 |

OTHER PUBLICATIONS

English machine translation of JP-09113943 (1997).*
Visco—Surface modification by ion implant—Intern'l.J.Poly.Anal. Charact.—2010 (Year: 2010).*
Lucca, D.A., et al., "Effects of ion implantation on the surface mechanical properties of sol-gel derived TEOS/MTES thin films," Nuclear Instruments and Methods in Physics Research B 257 pp. 577-580 (2007).
Adam, L.S., et al., "Diffusion of implanted nitrogen in silicon," Journal of Applied Physics, vol. 87, No. 5, pp. 2282-2284 (Mar. 1, 2000).
Nasu, S., et al., "Lamellar self-assembly of a porphyrin derivative possessing poly(ethylene oxide) methyl ether and the formation of a silica-porphyrin hybrid with tetraethoxysilane," Journal of Colloid and Interface Science 348, pp. 446-451 (2010).
Lucca, D.A. et al., "Effects of ion implantation on the surface mechanical properties of sol-gel derived TEOS/MTES thin films," ScienceDirect, Nuclear Instruments and Methods in Physics Research B 257 (2007) pp. 577-580.

* cited by examiner

PLASTIC SUBSTRATE WITH IMPROVED HARDNESS AND DISPLAY DEVICE INCLUDING THE SAME

CROSS-REFERENCE TO RELATED APPLICATION

This application is a divisional application of U.S. patent application Ser. No. 15/647,010, filed on Jul. 11, 2017, which claims priority to and the benefit of Korean Patent Application No. 10-2016-0087605, filed on Jul. 11, 2016, in the Korean Intellectual Property Office (KIPO), the disclosure of each of which is incorporated by reference herein in their entirety.

BACKGROUND

1. Field

Embodiments of the present invention relate to a plastic substrate having improved hardness, a method of manufacturing the plastic substrate having improved hardness and a display device including the plastic substrate having improved hardness.

2. Discussion of Related Art

With the recent development of mobile devices, such as smart phones and tablet PCs, thinner and slimmer display devices are desired.

A display device includes a window for protecting a display surface. In general, the window may include glass or tempered glass with good mechanical properties. However, because glass is heavy and prone to breakage by impact, materials that may replace glass are being studied.

Plastic materials may be a suitable substitute for glass. Plastic materials have the characteristic of being lightweight and not easily broken. However, plastic materials generally have lower hardness and lower abrasion resistance than glass.

It is to be understood that this background of the technology section is intended to provide useful background information for understanding the technology disclosed herein. As such, the technology background section disclosed herein may include ideas, concepts or recognitions that were not part of what was known or appreciated by those skilled in the pertinent art prior to the effective filing date of the subject matter disclosed herein.

SUMMARY

One or more embodiments of the present invention are directed to a plastic substrate having excellent hardness and abrasion resistance and a method of manufacturing the plastic substrate.

Further, one or more embodiments of the present invention are directed to a display device including the plastic substrate having excellent hardness and abrasion resistance.

According to an exemplary embodiment, a plastic substrate includes: a plastic support member having light transmittance; and a first organic-inorganic hybrid layer on the plastic support member. The first organic-inorganic hybrid layer includes: a first organic-inorganic hybrid matrix; and ions implanted into the first organic-inorganic hybrid matrix at a side opposite to a side adjacent the plastic support member. An amount of the ions per unit area (an ion amount) is in a range from about $2\times10^{13}/cm^2$ to about $2\times10^{14}/cm^2$.

An implantation depth of the ions may be in a range from about 300 nm to about 400 nm.

The ions may be implanted at an energy in a range from about 60 keV to about 80 keV.

The ions may include at least one of a boron (B) ion and a nitrogen (N) ion.

The first organic-inorganic hybrid matrix may include a silicone resin and a polymer resin.

The first organic-inorganic hybrid layer may have a thickness ranging from about 2 μm to about 20 μm.

The plastic support member may include at least one selected from the group consisting of: a polycarbonate (PC) film, a polyacrylic film, a polymethyl methacrylate (PMMA) film, a polyimide (PI) film, a polyethylene (PET) film, a polypropylene (PP) film, a polystyrene (PS) film, a polyamide (PA) film, a polyacetal (POM) film, a polybutylene terephthalate (PBT) film, a cellulose film and an acrylic-polycarbonate copolymer alloy film.

The plastic substrate may further include a first inorganic layer between the plastic support member and the first organic-inorganic hybrid layer.

The plastic substrate may further include a second organic-inorganic hybrid layer between the plastic support member and the first inorganic layer.

The plastic substrate may further include a first organic layer between the plastic support member and the first organic-inorganic hybrid layer.

According to another exemplary embodiment, a method of manufacturing a plastic substrate includes: forming a first organic-inorganic hybrid matrix on a plastic support member, the plastic support member having light transmittance; and implanting ions into the first organic-inorganic hybrid matrix. An amount of the ions per unit area (an ion amount) is in a range from about $2\times10^{13}/cm^2$ to about $2\times10^{14}/cm^2$.

An implantation depth of the ions may be in a range from about 300 nm to about 400 nm.

The ions may be implanted at an energy in a range from about 60 keV to about 80 keV.

The ions may include at least one of a boron (B) ion and a nitrogen (N) ion.

According to another exemplary embodiment, a display device includes: a display panel; and a window on the display panel. The window includes: a plastic support member having light transmittance; and a first organic-inorganic hybrid layer on the plastic support member, the first organic-inorganic hybrid layer including ions implanted at a side an opposite to a side adjacent the plastic support member. An amount of the ions per unit area (an ion amount) is in a range from about $2\times10^{13}/cm^2$ to about $2\times10^{14}/cm^2$.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present invention will become more apparent by describing in detail exemplary embodiments thereof with reference to the accompanying drawings, wherein.

DETAILED DESCRIPTION

Figure 1:
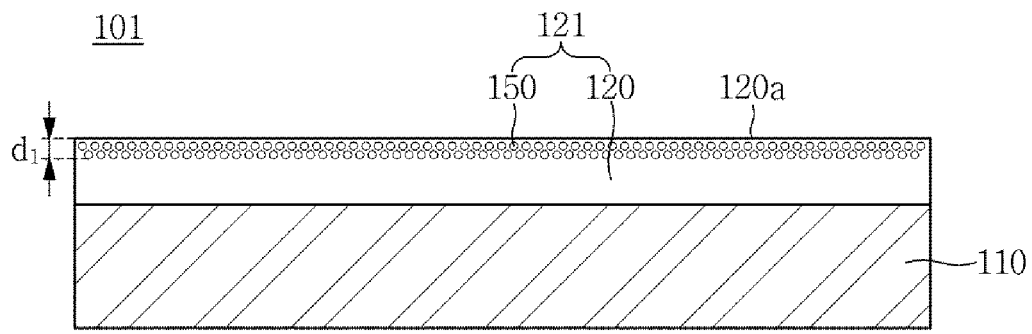
FIG. 1 is a cross-sectional view illustrating a plastic substrate according to a first exemplary embodiment.

Exemplary embodiments are described more fully hereinafter with reference to the accompanying drawings. Although the invention may be modified in various manners and has several exemplary embodiments, some exemplary embodiments are illustrated in the accompanying drawings and will be mainly described in the specification. These embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described.

In the drawings, relative sizes, thicknesses, etc. of layers, elements, regions, and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5%, etc. of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Some of the parts which are not associated with the description may not be provided in order to specifically describe embodiments of the present invention and like reference numerals refer to like elements throughout the specification.

Hereinafter, a first exemplary embodiment is described with reference to FIG. 1.

FIG. 1 is a cross-sectional view illustrating a plastic substrate 101 according to a first exemplary embodiment.

The plastic substrate 101 according to the first exemplary embodiment includes a plastic support member 110 having light transmittance and a first organic-inorganic hybrid layer 121 on the plastic support member 110.

A plastic film having light transmittance may be utilized as the plastic support member 110. For example, a polycarbonate (PC) film, a polyacrylic film, a polymethyl methacrylate (PMMA) film, a polyimide (PI) film, a polyethylene (PET) film, a polypropylene (PP) film, a polystyrene (PS) film, a polyamide (PA) film, a polyacetal (POM) film, a polybutylene terephthalate (PBT) film, a cellulose film and/or an acrylic-polycarbonate copolymer alloy film may be utilized as the plastic support member 110.

For example, a film including a copolymer of PC and PMMA may be used as the plastic support member 110. The copolymer of PC and PMMA may include PC in an amount ranging from about 50 percent by weight (wt %) to about 70 wt % and PMMA in an amount ranging from about 30 wt % to about 50 wt %. For example, a film including a copolymer of PC and PMMA in a weight ratio of 6:4 may be utilized as the plastic support member 110.

The plastic support member 110 may have a thickness ranging from about 400 µm to about 1000 µm. When the thickness of the plastic support member 110 is less than about 400 µm, the supporting strength may be relatively weak (or weakened), and when the thickness is greater than about 1000 µm, it is disadvantageous for slimming down the device (or the device may be relatively thick).

The first organic-inorganic hybrid layer 121 may include a first organic-inorganic hybrid matrix 120 and an ion 150 implanted into the first organic-inorganic hybrid matrix 120.

The first organic-inorganic hybrid matrix 120 may include a polymer resin and a silicone resin.

The polymer resin may include at least one of an acrylic resin, a urethane resin and/or a urethane-acrylate resin. For example, a urethane-acrylate copolymer resin may be utilized as the polymer resin. However, the polymer resin is not limited thereto.

The silicone resin may include at least one of a monomer represented by the following Chemical Formula 1 and a monomer represented by the following Chemical Formula 2. For example, the silicone resin may be formed by polymerization of a composition including at least one of the monomer represented by the following Chemical Formula 1 and the monomer represented by the following Chemical Formula 2.

Chemical Formula 1

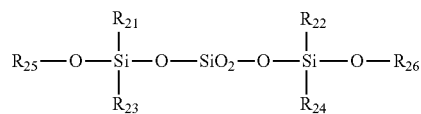

In Chemical Formula 1, respective ones of $R_{21}$, $R_{22}$, $R_{23}$ and $R_{24}$ are one of an amino group, an epoxy group, a phenyl group, an acryl group and/or a vinyl group, and respective ones of $R_{25}$ and $R_{26}$ are hydrogen (H) and/or a hydrocarbon group having 1 to 6 carbon atoms.

Chemical Formula 2

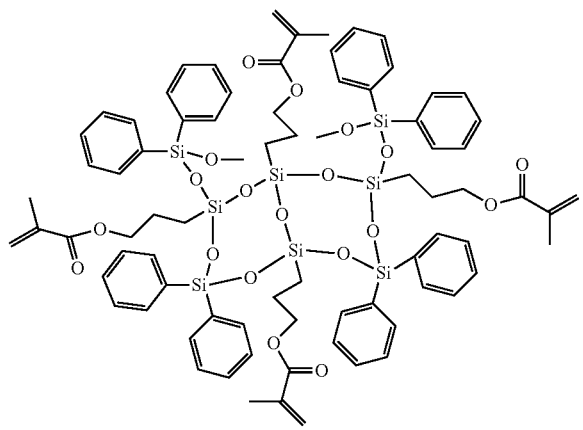

For example, the first organic-inorganic hybrid matrix 120 may be formed by polymerization of a polymerizable composition including a polymer resin-forming monomer and/or a silicone resin-forming monomer.

The first organic-inorganic hybrid layer 121 has a thickness ranging from about 2 µm to about 20 µm.

When the thickness of the first organic-inorganic hybrid layer 121 is less than about 2 µm, the first organic-inorganic hybrid layer 121 may not have sufficient strength and ion implantation may be difficult (or may not be easy). In addition, when the thickness of the first organic-inorganic hybrid layer 121 is greater than about 20 µm, it is disadvantageous for slimming down the device (or the device may be relatively thick).

The ions 150 may be implanted at (or on) a side of the first organic-inorganic hybrid matrix 120 that is opposite to the plastic support member 110. For example, the ions 150 may be implanted through a surface 120a of the first organic-inorganic hybrid matrix 120 at (or on) an opposite side from the plastic support member 110.

An amount (or quantity) of ions 150 implanted into the first organic-inorganic hybrid matrix 120 may range from about $2\times10^{13}/cm^2$ to about $2\times10^{14}/cm^2$. The amount of ions 150 is expressed by the number of ions per unit area ($cm^2$). Hereinafter, an amount of ions 150 per unit area is referred to as an "ion amount".

When the ion amount is less than about $2\times10^{13}/cm^2$, the hardness and strength of the first organic-inorganic hybrid layer 121 may be relatively low (or lower than desired). In addition, when the ion amount exceeds about $2\times10^{14}/cm^2$, yellow shift, i.e., a color shift toward yellow, may occur.

The ions 150 implanted into the first organic-inorganic hybrid matrix 120 may include at least one of boron (B) ions and nitrogen (N) ions. The condition for boron (B) ion implantation and the condition for nitrogen (N) ion implantation may be different from each other.

An implantation depth of the ions 150 may be in a range from about 300 nm to about 400 nm. The implantation depth of the ions 150 is represented by a distance d1 from the surface 120a.

According to the first exemplary embodiment, the ion amount of about $2\times10^{13}/cm^2$ or more is maintained from the surface 120a of the first organic-inorganic hybrid matrix 120 to a depth of about 300 nm to about 400 nm (or such that the distance d1 is about 300 nm to about 400 nm).

When the implantation depth of the ions 150 is less than about 300 nm, strength of the first organic-inorganic hybrid layer 121 may be insufficient (or relatively low). Further, when the ions 150 should be implanted with high energy (or relatively high energy) in order to implant ions 150 at an implantation depth of more than about 400 nm. In such an exemplary embodiment, the first organic-inorganic hybrid layer 121 may be damaged.

According to the first exemplary embodiment, the ions 150 are implanted at an energy ranging from about 60 keV to about 80 keV. When the ion implantation energy is less than about 60 keV, an ion implantation efficiency is lowered. In addition, when the ion implantation energy exceeds about 80 keV, the first organic-inorganic hybrid layer 121 may be damaged during the ion implantation process.

The first organic-inorganic hybrid layer 121 may further include fluorine (F) in an amount ranging from about 0.001 wt % to about 0.2 wt % with respect to the total weight of the first organic-inorganic hybrid layer 121. In addition, an anti-finger layer may be provided on the first organic-inorganic hybrid layer 121.

A second exemplary embodiment is described below with reference to FIG. 2. Hereinafter, in order to avoid duplication, descriptions of components that are the same or substantially the same as those described above may be omitted.

Figure 2:
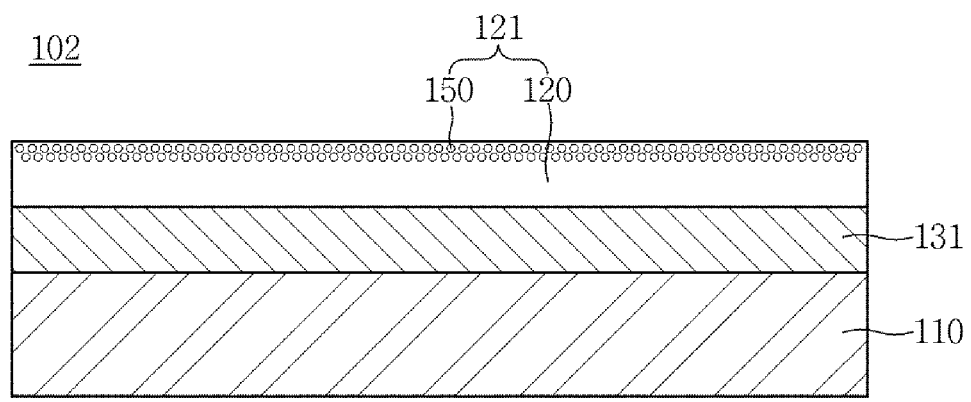
FIG. 2 is a cross-sectional view illustrating a plastic substrate according to a second exemplary embodiment.

FIG. 2 is a cross-sectional view illustrating a plastic substrate 102 according to the second exemplary embodiment.

The plastic substrate 102 according to the second exemplary embodiment includes a plastic support member 110, a first inorganic layer 131 on the plastic support member 110 and a first organic-inorganic hybrid layer 121 on the first inorganic layer 131.

The kind of the first inorganic layer 131 is not particularly limited. For example, the first inorganic layer 131 may include a layer including an inorganic material.

The first inorganic layer 131 may include, for example, a silicone resin. In addition, the first inorganic layer 131 may include a polymer resin and inorganic particles dispersed in the polymer resin. For example, the first inorganic layer 131 may include a polymer resin and silicon oxide (SiOx) dispersed in the polymer resin.

When the first inorganic layer 131 includes a polymer connection group, the plastic support member 110 and the first inorganic layer 131 may have a strong bonding force.

The first inorganic layer 131 may have a thickness ranging from about 3 μm to about 10 μm. When the thickness of the first inorganic layer 131 is less than about 3 μm, the strength of the plastic substrate 102 may be relatively weak (or weakened). In addition, when the thickness of the first inorganic layer 131 is greater than about 10 μm, it may be disadvantageous to slim down the device (or the device may be relatively thick).

Hereinafter, a third exemplary embodiment is described with reference to FIG. 3.

Figure 3:
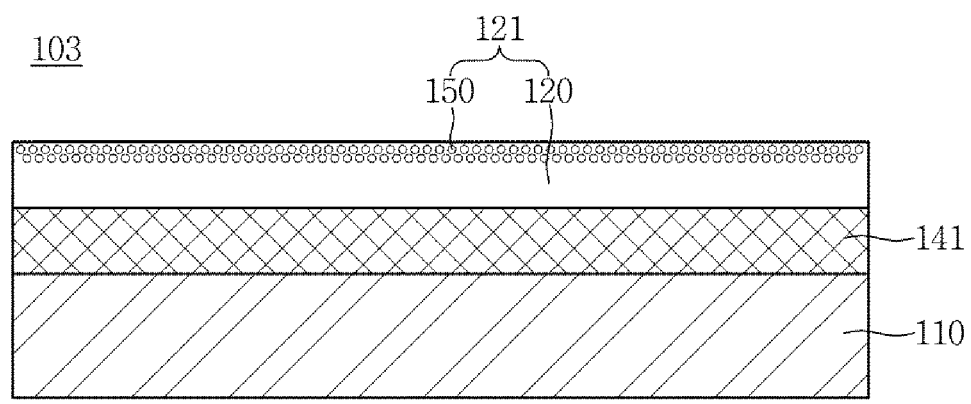
FIG. 3 is a cross-sectional view illustrating a plastic substrate according to a third exemplary embodiment.

FIG. 3 is a cross-sectional view illustrating a plastic substrate 103 according to the third exemplary embodiment.

The plastic substrate 103 according to the third exemplary embodiment includes a plastic support member 110, a first organic layer 141 on the plastic support member 110 and a first organic-inorganic hybrid layer 121 on the first organic layer 141.

The kind of the first organic layer 141 is not particularly limited. For example, the first organic layer 141 may include at least one of an acrylic resin, a urethane resin and a urethane-acrylate resin. The first organic layer 141 may be formed by curing a coating solution for forming an organic layer.

The first organic layer 141 may serve as a buffer for stress generated between layers.

The first organic layer 141 may have a thickness ranging from about 5 μm to about 10 μm. When the thickness of the first organic layer 141 is less than about 5 μm, an interlayer buffer effect may be reduced. When the thickness is greater than about 10 μm, it may be disadvantageous to slim down the device (or the device may be relatively thick).

Hereinafter, a fourth exemplary embodiment is described with reference to FIG. 4.

Figure 4:
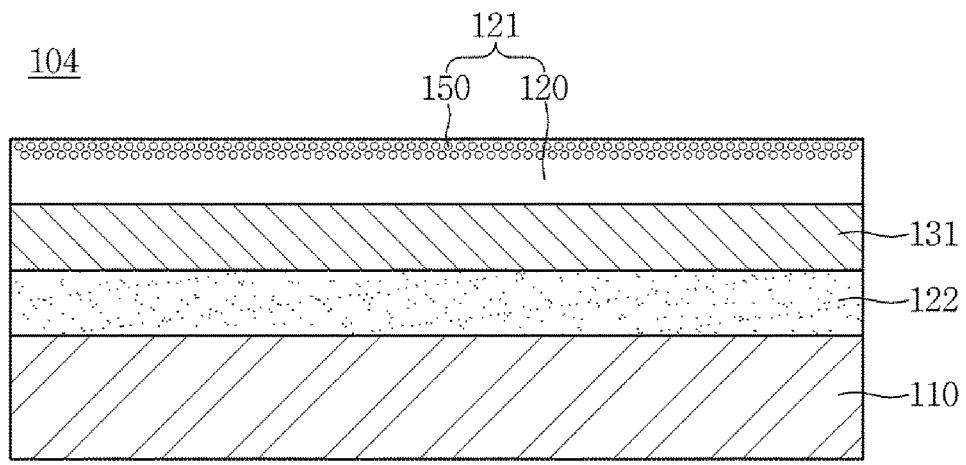
FIG. 4 is a cross-sectional view illustrating a plastic substrate according to a fourth exemplary embodiment.

FIG. 4 is a cross-sectional view illustrating a plastic substrate 104 according to the fourth exemplary embodiment.

The plastic substrate 104 according to the fourth exemplary embodiment includes a plastic support member 110, a second organic-inorganic hybrid layer 122 on the plastic support member 110, a first inorganic layer 131 on the second organic-inorganic hybrid layer 122 and a first organic-inorganic hybrid layer 121 on the first inorganic layer 131.

According to the fourth exemplary embodiment, ions 150 are not implanted into the second organic-inorganic hybrid layer 122. The second organic-inorganic hybrid layer 122 may have a composition that is substantially the same as that of a first organic-inorganic hybrid matrix 120 (see, e.g., FIG. 1).

Hereinafter, a fifth exemplary embodiment is described with reference to FIG. 5.

Figure 5:
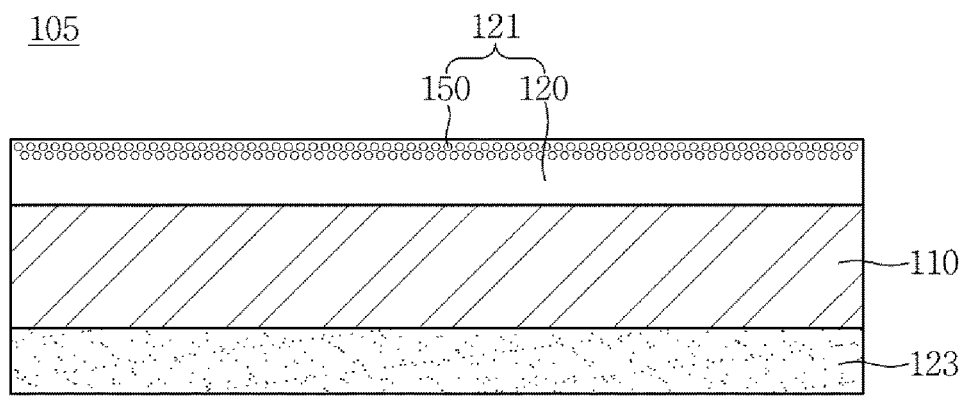
FIG. 5 is a cross-sectional view illustrating a plastic substrate according to a fifth exemplary embodiment.

FIG. 5 is a cross-sectional view illustrating a plastic substrate 105 according to the fifth exemplary embodiment.

The plastic substrate 105 according to the fifth exemplary embodiment includes a plastic support member 110, a first organic-inorganic hybrid layer 121 on the plastic support member 110 and a third organic-inorganic hybrid layer 123 on an opposite surface (or opposite side) of the plastic support member 110 from the first organic-inorganic hybrid layer 121.

For example, the first organic-inorganic hybrid layer 121 may be on (or at) a first surface of the plastic support member 110 and the third organic-inorganic hybrid layer 123 may be on (or at) a second surface of the plastic support member 110. The first surface of the plastic support member 110 may be opposite to the second surface of the plastic support member 110.

According to the fifth exemplary embodiment, ions 150 are not implanted into the third organic-inorganic hybrid layer 123. The third organic-inorganic hybrid layer 123 may have a composition that is substantially the same as that of the first organic-inorganic hybrid matrix 120.

Hereinafter, a sixth exemplary embodiment is described with reference to FIG. 6.

Figure 6:
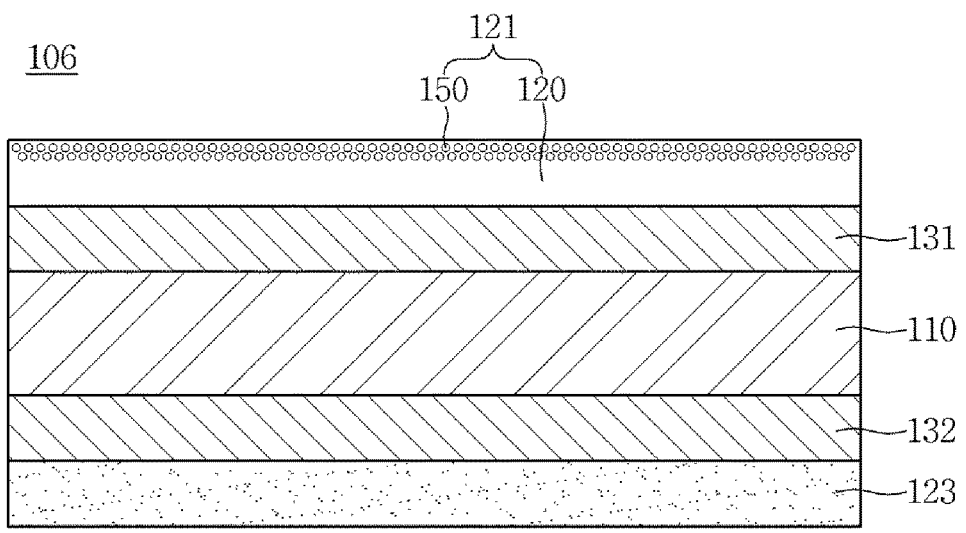
FIG. 6 is a cross-sectional view illustrating a plastic substrate according to a sixth exemplary embodiment.

FIG. 6 is a cross-sectional view illustrating a plastic substrate 106 according to the sixth exemplary embodiment.

The plastic substrate 106 according to the sixth exemplary embodiment includes a plastic support member 110, a first inorganic layer 131 on (or at) a surface (or a first surface) of the plastic support member 110, a first organic-inorganic hybrid layer 121 on the first inorganic layer 131, a second inorganic layer 132 on (or at) another surface (or a second surface) of the plastic support member 110 and a third organic-inorganic hybrid layer 123 on the second inorganic layer 132.

The second inorganic layer 132 may have a composition that is substantially the same as that of the first inorganic layer 131.

Hereinafter, a seventh exemplary embodiment will be described with reference to FIG. 7.

Figure 7:
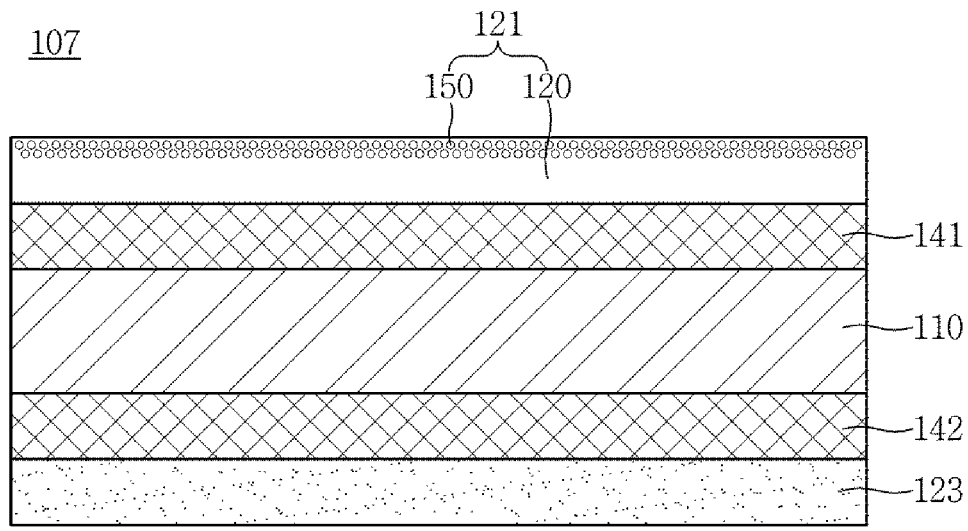
FIG. 7 is a cross-sectional view illustrating a plastic substrate according to a seventh exemplary embodiment.

FIG. 7 is a cross-sectional view illustrating a plastic substrate 107 according to the seventh exemplary embodiment.

The plastic substrate 107 according to the seventh exemplary embodiment includes a plastic support member 110, a first organic layer 141 on (or at) a surface (or a first surface) of the plastic support member 110, a first organic-inorganic hybrid layer 121 on the first organic layer 141, a second organic layer 142 on (or at) another surface (or a second surface opposite to the first surface) of the plastic support member 110 and a third organic-inorganic hybrid layer 123 on the second organic layer 142.

The second organic layer 142 may have a composition that is substantially the same as that of the first organic layer 141.

Hereinafter, an eighth exemplary embodiment is described below with reference to FIG. 8.

Figure 8:
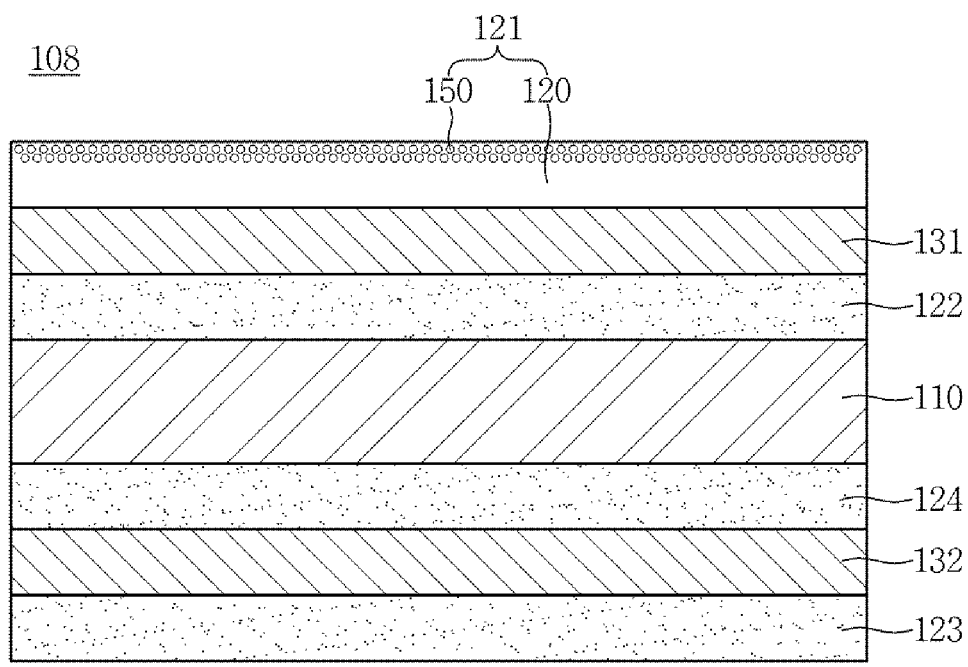
FIG. 8 is a cross-sectional view illustrating a plastic substrate according to an eighth exemplary embodiment.

FIG. 8 is a cross-sectional view illustrating a plastic substrate 108 according to the eighth exemplary embodiment.

The plastic substrate 108 according to the eighth exemplary embodiment includes a plastic support member 110, a second organic-inorganic hybrid layer 122 on (or at) a surface (or a first surface) of the plastic support member 110, a first inorganic layer 131 on the second organic-inorganic hybrid layer 122, a first organic-inorganic hybrid layer 121 on the first inorganic layer 131, a fourth organic-inorganic hybrid layer 124 on (or at) another surface (or a second surface opposite to the first surface) of the plastic support member 110, a second inorganic layer 132 on the fourth organic-inorganic hybrid layer 124 and a third organic-inorganic hybrid layer 123 on the second inorganic layer 132.

The second organic-inorganic hybrid layer 122, the third organic-inorganic hybrid layer 123 and the fourth organic-inorganic hybrid layer 124 may each have substantially the same composition.

A method of manufacturing a plastic substrate according to an exemplary embodiment includes forming the first organic-inorganic hybrid matrix 120 on the plastic support member 110 having light transmitting characteristics and implanting ions 150 into the first organic-inorganic hybrid matrix 120.

Hereinafter, a method of manufacturing the plastic substrate 105 according to the fifth exemplary embodiment by a dip coating method is described.

According to some embodiments, in order to manufacture the plastic substrate 105, first, the plastic support member 110 is immersed in a coating solution for forming the organic-inorganic hybrid matrix such that a coating layer is formed on each of opposite sides of the plastic support member 110 (e.g., on a first surface of the plastic support member 110 and on a second surface of the plastic support member 110).

The coating layer formed on the first surface of the plastic support member 110 is cured and the ions 150 are implanted therein to form the first organic-inorganic hybrid layer 121. In addition, the coating layer formed on the second surface of the plastic support member 110 is cured to form the third organic-inorganic hybrid layer 123.

The coating solution for forming the organic-inorganic hybrid matrix may include an organic binder component and a silicone monomer.

The silicone monomer includes at least one of a monomer represented by the following Chemical Formula 1 and a monomer represented by the following Chemical Formula 2.

Chemical Formula 1

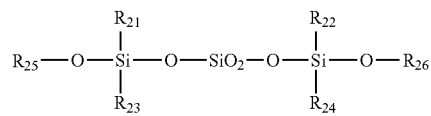

In Chemical Formula 1, respective ones of $R_{21}$, $R_{22}$, $R_{23}$ and $R_{24}$ are one of an amino group, an epoxy group, a phenyl group, an acryl group and/or a vinyl group, and respective ones of $R_{25}$ and $R_{26}$ are hydrogen (H) and/or a hydrocarbon group having 1 to 6 carbon atoms.

Chemical Formula 2

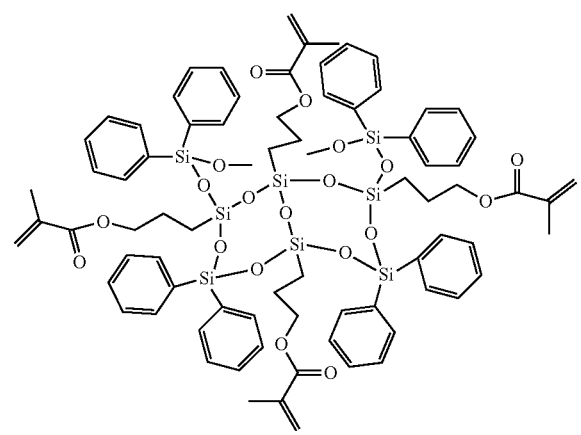

The organic binder component includes monomers, oligomers and/or photoinitiators. The organic binder component may include a monomer in an amount ranging from about 20 wt % to about 60 wt %, an oligomer in an amount ranging from about 20 wt % to about 60 wt %, a rubber-based flexible component in an amount ranging from about 10 wt % to about 50 wt % and a photoinitiator in an amount ranging from about 1 wt % to about 10 wt %, with respect to the total weight of the organic binder component.

The monomer may include, for example, at least one of an acrylic monomer, a urethane monomer, and a urethane-acrylic monomer.

The oligomer may use urethane (metha) acrylate having a weight average molecular weight (Mw) ranging from about 5,000 to about 50,000.

When the weight average molecular weight (Mw) of the oligomer is more than about 50,000, opacity in a high temperature and high humidity environment may be unsuitable. When the weight average molecular weight (Mw) of the oligomer is less than about 5,000, the coating solution for forming an organic-inorganic hybrid layer may not be maintained in a solid state at room temperature.

As an example, after the first and second inorganic layers 131 and 132 are formed on opposite sides of the plastic support member 110, the first and third organic-inorganic hybrid layers 121 and 123 may be formed thereon (see, e.g., FIG. 6).

As another example, after the first and second organic layers 141 and 142 are formed on opposite sides of the plastic support member 110, the first and third organic-inorganic hybrid layers 121 and 123 may be formed thereon (see, e.g., FIG. 7).

As another example, after the second and fourth organic-inorganic hybrid layers 122 and 124 are formed on opposite sides of the plastic support member 110, the first and second inorganic layers 131 and 132 are formed thereon, and then the first and third organic-inorganic hybrid layers 121 and 123 may be formed thereon (see, e.g., FIG. 8).

For evaluation of ion implantation characteristics, a sample having a structure that is substantially the same as that of the plastic substrate 101 described above in reference to the first exemplary embodiment is produced.

For example, a polycarbonate film having a thickness of about 550 μm is utilized as the plastic support member 110. The first organic-inorganic hybrid matrix 120 including a urethane acrylate resin (a polymer resin) in an amount of about 60 wt % and a silicone resin in an amount of about 40% is disposed on the plastic support member 110 to form each sample.

Next, boron (B) ions are implanted into the first organic-inorganic hybrid matrix 120 of each sample according to the ion implantation conditions illustrated in Table 1 below to produce a plastic substrate. The evaluation results of the physical properties are illustrated in Table 1.

TABLE 1

| Sample No. | Ion implantation condition | | | Property Evaluation | | | | | |
|---|---|---|---|---|---|---|---|---|---|
| | Kind | Energy | Ion amount (/cm$^2$) | Pencil hardness | Transmittance (%) | Reflectance (%) | Appearance | YI | Chromaticity (b*) |
| Reference Example 1 | — | — | — | 7 H | 91.6 | 7.9 | transparent | 1.1 | −0.4 |
| Sample 1 | Boron | 80 kev | 1 × 10$^{14}$ | 8 H | 92.1 | 8.1 | transparent | 1.5 | −0.3 |
| Sample 2 | Boron | 80 kev | 2 × 10$^{14}$ | 8 H | 90.7 | 8.4 | discolored | 3.2 | −0.2 |
| Sample 3 | Boron | 80 kev | 3 × 10$^{14}$ | 7~8 H | 90.2 | 8.5 | discolored | 4.6 | 0.1 |
| Sample 4 | Boron | 80 kev | 5 × 10$^{14}$ | 8 H~9 H | 89.4 | 8.6 | discolored | 9.2 | 1.0 |
| Sample 5 | Boron | 80 kev | 1 × 10$^{15}$ | 9 H | 80.9 | 8.8 | discolored | 26.6 | 3.5 |
| Sample 6 | Boron | 60 kev | 1 × 10$^{14}$ | 7~8 H | 92.0 | 8.2 | transparent | 1.4 | −0.2 |
| Sample 7 | Boron | 60 kev | 2 × 10$^{14}$ | 7~8 H | 90.4 | 8.5 | transparent | 2.8 | 0.1 |
| Sample 8 | Boron | 60 kev | 3 × 10$^{14}$ | 8 H | 90.3 | 8.6 | discolored | 3.7 | 0.6 |
| Sample 9 | Boron | 60 kev | 5 × 10$^{14}$ | 8 H | 90.0 | 8.8 | discolored | 6.3 | 1.2 |
| Sample 10 | Boron | 60 kev | 1 × 10$^{15}$ | 8~9 H | 86.1 | 9.1 | discolored | 15.2 | 2.9 |

In Table 1, Reference Example 1 is a sample in which ion implantation is not performed.

The evaluation methods of physical properties illustrated in Table 1 are as follows.

The pencil hardness is evaluated in accordance with the pencil hardness test specified in JIS K 5600-5-4. For example, the pencil hardness is measured five times on the sample with respect to a weight of 1 kg, and the smallest value is selected as a pencil hardness of the sample.

In the pencil hardness, the reference marks "H," "F" and "B," initials of "hard," "firm," and "black," respectively, represent hardness and concentration. As a number of an "H" lead or a "B" lead increases, the "H" lead becomes harder, whereas the "B" lead becomes smoother. That is, "9H" denotes a highest hardness, and the hardness decreases in the following order: 8H, 7H, 6H, 5H, 4H, 3H, 2H, H, F, B, 2B, 3B, 4B, 5B, 6B, 7B, 8B and 9B.

For evaluation of the optical characteristics, transmittance and reflectance are measured using a spectrophotometer (exemplary device name: "COH-400").

For appearance evaluation, discoloration of the sample is visually identified. For example, it is evaluated whether or not the yellow shift is observed in the sample.

The reference mark "YI" indicates a yellow index. The larger the YI value is, the larger the yellow shift.

The chromaticity (b*) represents the yellow shift according to the CIE 1976(L*,a*,b*) color coordinates. Herein, a positive value of 1b* corresponds to the degree of yellow shift and a negative value of 1b* corresponds to the degree of blue shift.

Referring to Table 1, in particular, Sample 1, Sample 6 and Sample 7 are evaluated to have excellent physical properties.

In addition, nitrogen (N) ions are implanted into the first organic-inorganic hybrid matrix 120 of each sample according to the ion implantation conditions illustrated in Table 2 below to produce a plastic substrate. The evaluation results of the physical properties are illustrated in Table 2.

having a steel wool #0000 uniformly attached thereto is prepared. Subsequently, a surface of the sample is rubbed back and forth six hundred times with the flat surface of the cylinder having the steel wool #0000 thereon, with a weight of about 1.0 kg at a speed of about 100 mm a second, and the depth and width of scratches generated on the surface of the sample are measured. The scratch resistance evaluation results for Reference Example 1 and Samples 1, 6 and 9 are shown in FIG. 9.

Figure 9:
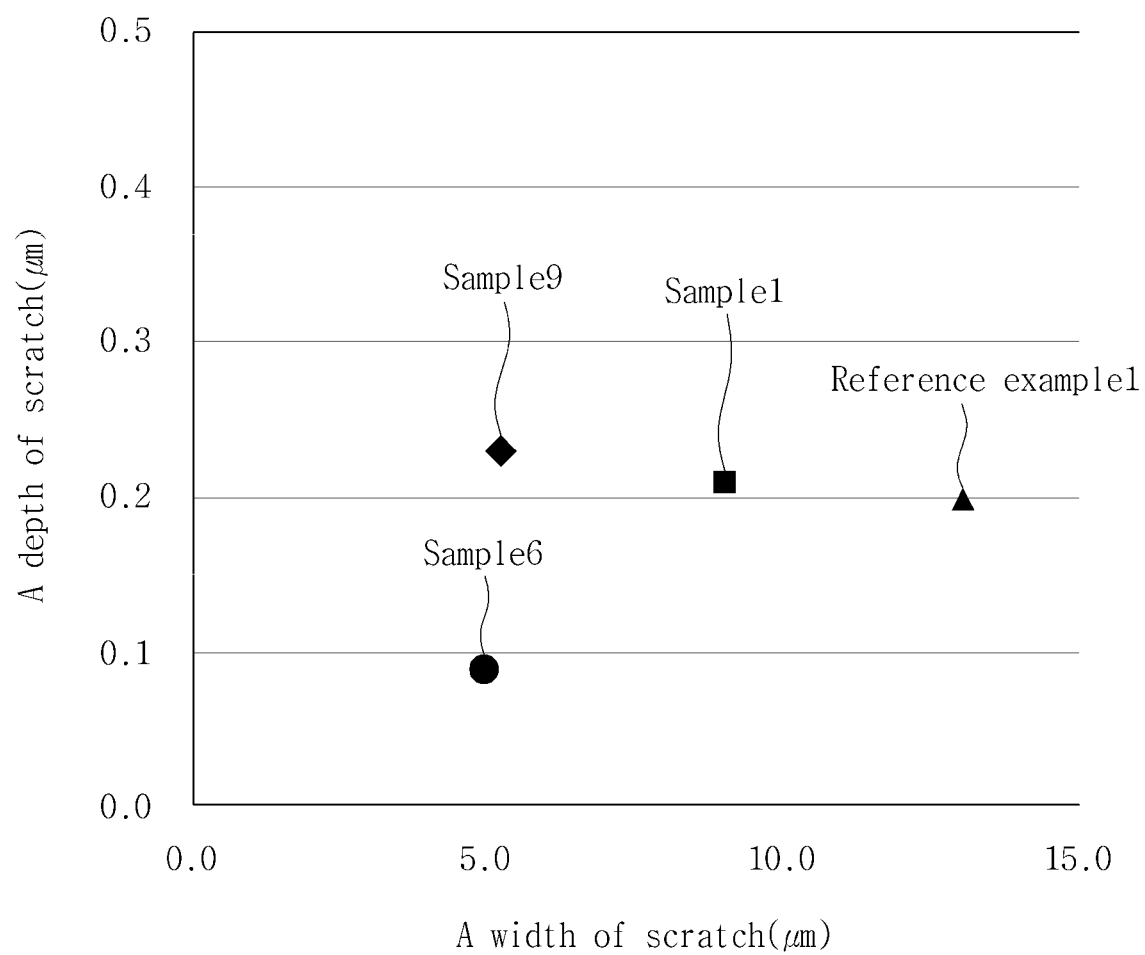
FIG. 9 is a chart illustrating results of a scratch resistance evaluation.

Referring to FIG. 9, samples 6 and 9 have particularly excellent scratch resistance.

Figure 10:
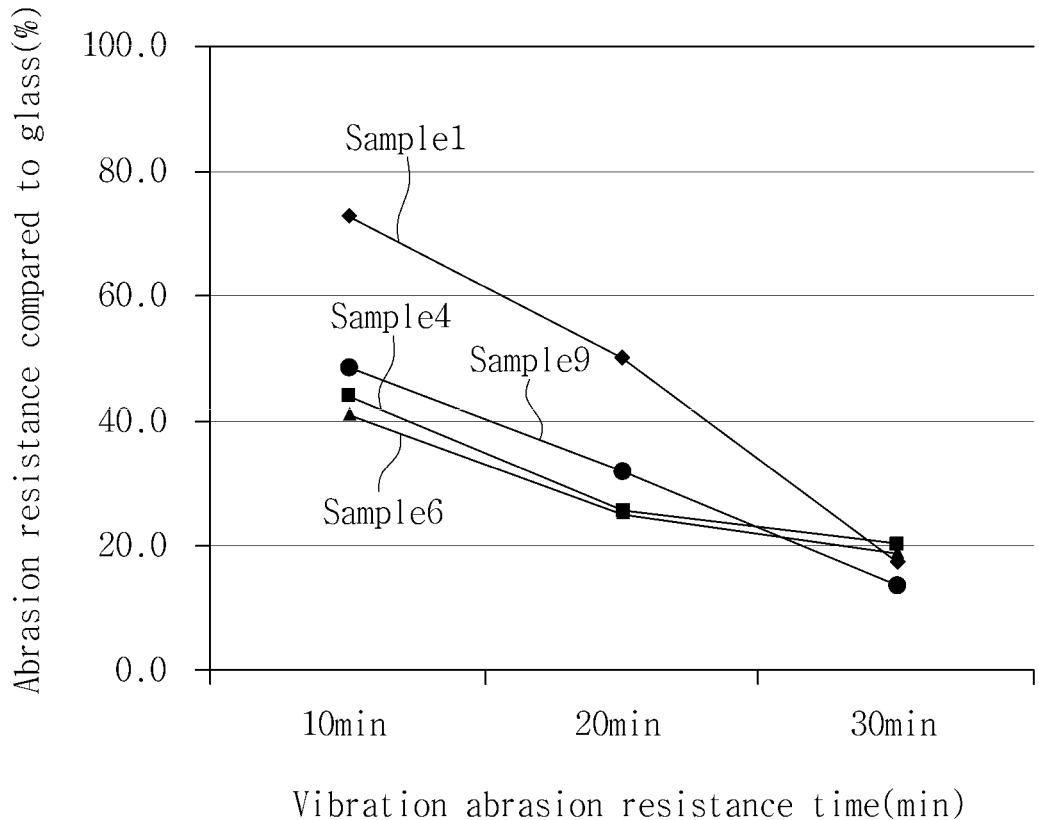
FIG. 10 is a chart illustrating results of a vibration abrasion resistance evaluation.

FIG. 10 shows the results of a vibration abrasion resistance evaluation.

For evaluating vibration abrasion resistance, a commercially available vibration abrasion tester (e.g., a Rösler vibration abrasion tester) is utilized. Vibration and abrasion are applied to the sample by using the vibration abrasion tester. The abrasion resistance is evaluated by the ratio of abrasion resistance of samples to glass over time. FIG. 10 shows results of vibration abrasion resistance evaluation for Samples 1, 4, 6 and 9.

Referring to FIG. 10, Samples 1 and 9 have excellent abrasion resistance.

Referring to Tables 1 and 2 and FIGS. 9 and 10, when the ion amount is in a range from about $2\times10^{13}/cm^2$ to about $2\times10^{14}/cm^2$ and the ion implantation energy is in a range from about 60 keV to about 80 keV, the sample is evaluated to have excellent physical properties.

FIGS. 11A, 11B, 11C, 11D, 11E and 11F are graphs illustrating ion intensity depending on an ion implantation depth.

For example, FIGS. 11A, 11B, 11C, 11D, 11E and 11F illustrate the ion intensity (c/s) depending on the ion implantation depth (nm) when ions 150 are implanted into the first organic-inorganic hybrid matrix 120.

Figure 11A:
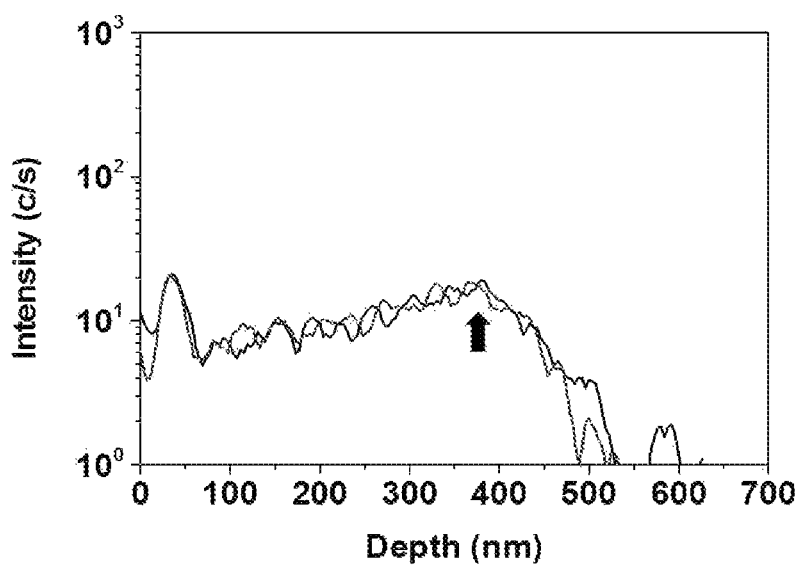
FIGS. 11A-11F are graphs illustrating ion intensity according to an ion implantation depth.
Figure 11B:
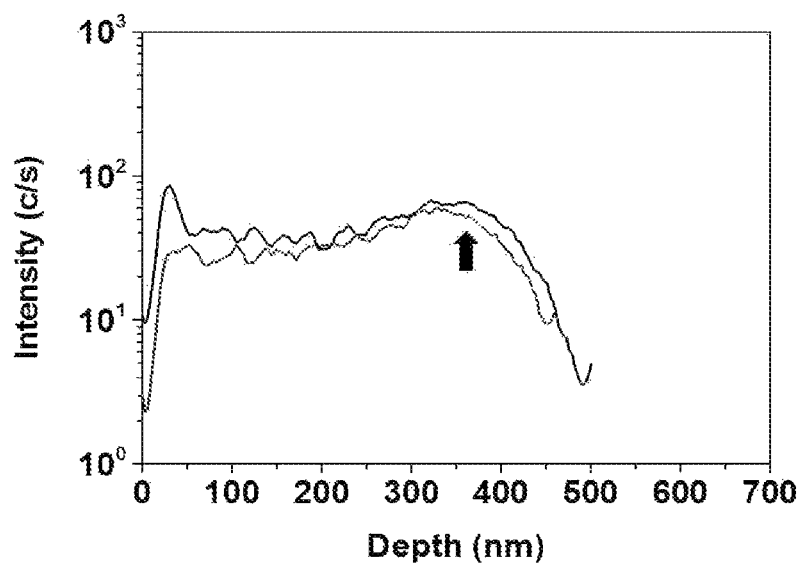

FIG. 11A shows the ion intensity depending on the ion implantation depth when ions 150 of about $1.0\times10^{14}/cm^2$ are implanted with an energy of about 80 keV, FIG. 11B shows

TABLE 2

| | Ion implantation condition | | | Property Evaluation | | | | | |
|---|---|---|---|---|---|---|---|---|---|
| Sample No. | Kind | Energy | Ion amount (/cm²) | Pencil hardness | Transmittance (%) | Reflectance (%) | Appearance | YI | Chromaticity (b*) |
| Reference Example 2 | — | — | — | 5 H | 91.8 | 8.0 | transparent | 0.8 | −0.3 |
| Sample 11 | Nitrogen | 80 kev | $1 \times 10^{13}$ | 5 H | 92.0 | 7.9 | transparent | 0.7 | 0.2 |
| Sample 12 | Nitrogen | 80 kev | $2 \times 10^{13}$ | 6 H | 91.4 | 8.4 | transparent | 1.1 | 0.1 |
| Sample 13 | Nitrogen | 80 kev | $5 \times 10^{13}$ | 5 H | 89.7 | 8.4 | transparent | 2.5 | 1.1 |
| Sample 14 | Nitrogen | 80 kev | $1 \times 10^{14}$ | 5 H | 86.0 | 8.8 | discolored | 4.4 | 2.5 |
| Sample 15 | Nitrogen | 80 kev | $2 \times 10^{14}$ | 5 H | 85.5 | 10.0 | discolored | 9.0 | 4.6 |
| Sample 16 | Nitrogen | 60 kev | $1 \times 10^{13}$ | 6 H | 92.0 | 7.8 | transparent | 0.5 | −0.2 |
| Sample 17 | Nitrogen | 60 kev | $2 \times 10^{13}$ | 4 H | 91.6 | 8.1 | transparent | 0.8 | −0.3 |
| Sample 18 | Nitrogen | 60 kev | $5 \times 10^{13}$ | 6 H | 91.3 | 8.4 | transparent | 1.1 | 0.5 |
| Sample 19 | Nitrogen | 60 kev | $3 \times 10^{14}$ | 5 H | 80.0 | 9.8 | discolored | 11.6 | 10.1 |

Referring to Table 2, Samples 12, 16, 17 and 18 are evaluated to have excellent physical properties.

FIG. 9 shows the results of a scratch resistance evaluation.

Figure 11C:
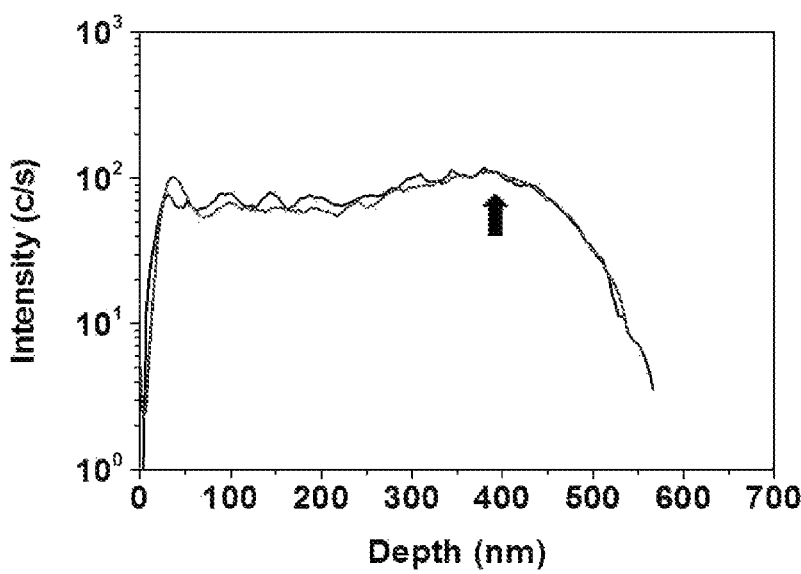
Figure 11D:
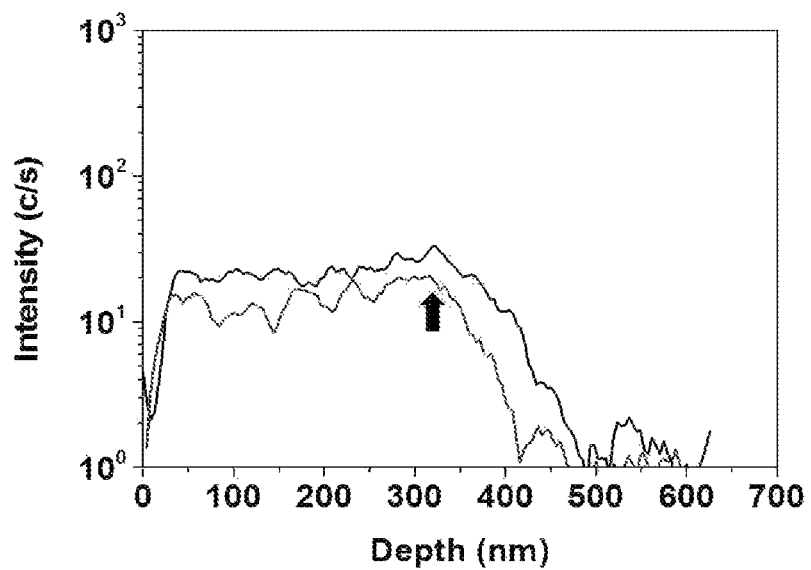
Figure 11E:
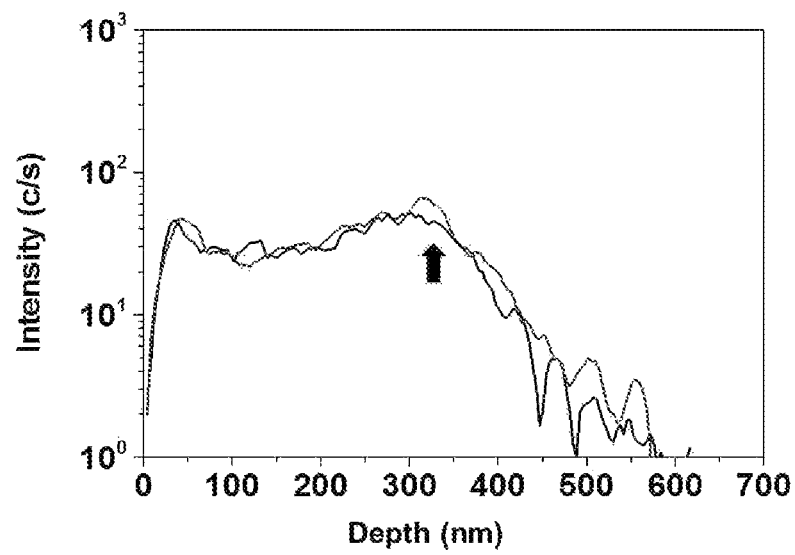
Figure 11F:
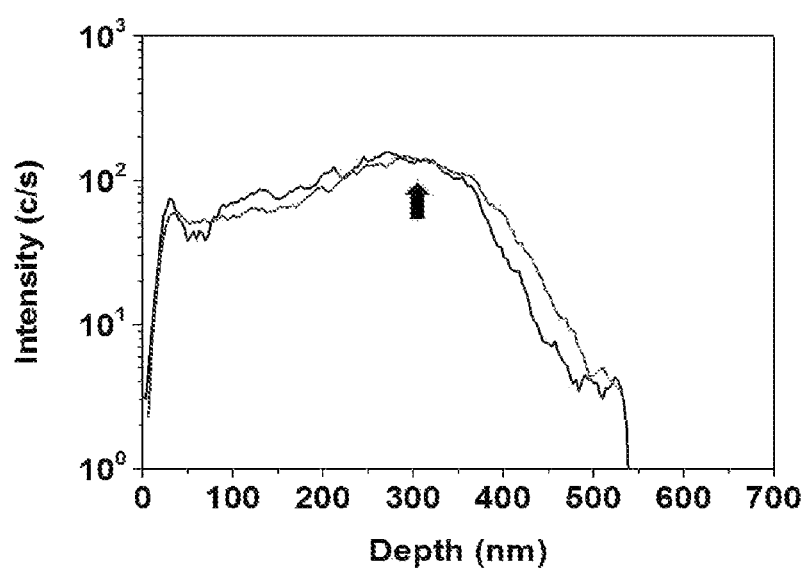

For scratch resistance evaluation, scratch resistance evaluation using a steel wool is performed. The scratch resistance evaluation method using a steel wool is as follows. A sample having a size of 200 mm×200 mm is manufactured using a plastic substrate. In addition, a cylinder having a diameter of about 25 mm and a flat surface the ion intensity depending on the ion implantation depth when ions 150 of about $5.0\times10^{14}/cm^2$ are implanted with an energy of about 80 keV, FIG. 11C shows the ion intensity depending on the ion implantation depth when ions 150 of about $1.0\times10^{15}/cm^2$ are implanted with an energy of about 80 keV, FIG. 11D shows the ion intensity depending on the ion implantation depth when ions 150 of about $1.0\times10^{14}/cm^2$ are implanted with an energy of about 60 keV, FIG. 11E shows the ion intensity depending on the ion implantation depth when ions 150 of about $5.0 \times 10^{14}/cm^2$ are implanted with an energy of about 60 keV, and FIG. 11F shows the ion intensity depending on the ion implantation depth when ions 150 of about $1.0 \times 10^{15}/cm^2$ are implanted with an energy of about 60 keV.

The samples according to FIGS. 11A, 11B, 11C, 11D, 11E and 11F are referred to as Test Examples 1, 2, 3, 4, 5 and 6, respectively. For each test example, the ion intensity depending on the ion implantation depth was measured twice.

The arrow illustrated in FIGS. 11A, 11B, 11C, 11D, 11E and 11F indicates a critical point of ion intensity. The depth at the critical point of ion intensity is referred to as the ion implantation depth.

The results of FIGS. 11A, 11B, 11C, 11D, 11E and 11F may be summarized in Table 3 below.

TABLE 3

| Test example | Ion Implan-tation energy | Ion Implan-tation amount (/cm²) | Critical point(nm) | Intensity (c/s) |
| --- | --- | --- | --- | --- |
| 1 (FIG. 11A) | 80 keV | $1.0 \times 10^{14}$ | 380 | 19 |
|  |  |  | 365 | 18 |
| 2 (FIG. 11B) | 80 keV | $5.0 \times 10^{14}$ | 360 | 67 |
|  |  |  | 335 | 65 |
| 3 (FIG. 11C) | 80 keV | $1.0 \times 10^{15}$ | 380 | 116 |
|  |  |  | 385 | 112 |
| 4 (FIG. 11D) | 60 keV | $1.0 \times 10^{14}$ | 330 | 33 |
|  |  |  | 315 | 21 |
| 5 (FIG. 11E) | 60 keV | $5.0 \times 10^{14}$ | 304 | 51 |
|  |  |  | 330 | 65 |
| 6 (FIG. 11F) | 60 keV | $1.0 \times 10^{15}$ | 300 | 156 |
|  |  |  | 300 | 143 |

Referring to FIGS. 11A, 11B, 11C, 11D, 11E and 11F, when ions 150 are implanted at an energy ranging from about 60 keV to about 80 keV, ions 150 are implanted to a depth ranging from about 300 nm to about 400 nm.

Figure 12:
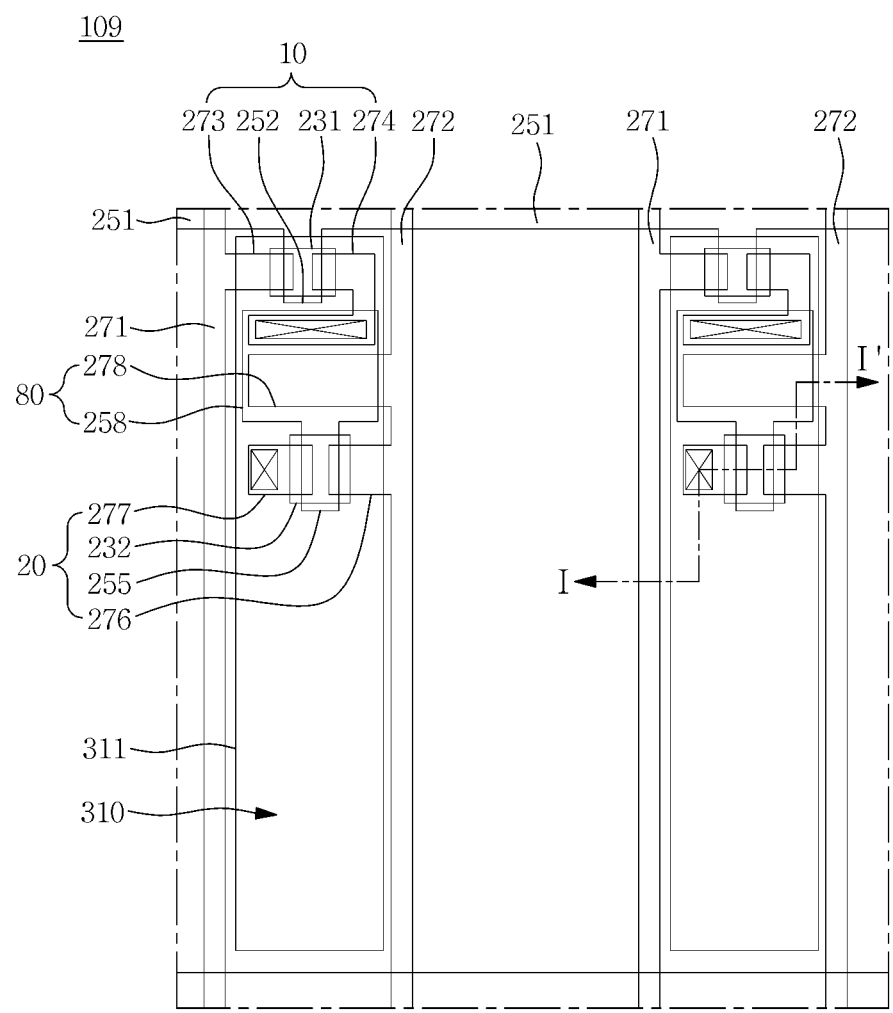
FIG. 12 is a plan view illustrating an organic light emitting diode ("OLED") display device according to a ninth exemplary embodiment.
Figure 13:
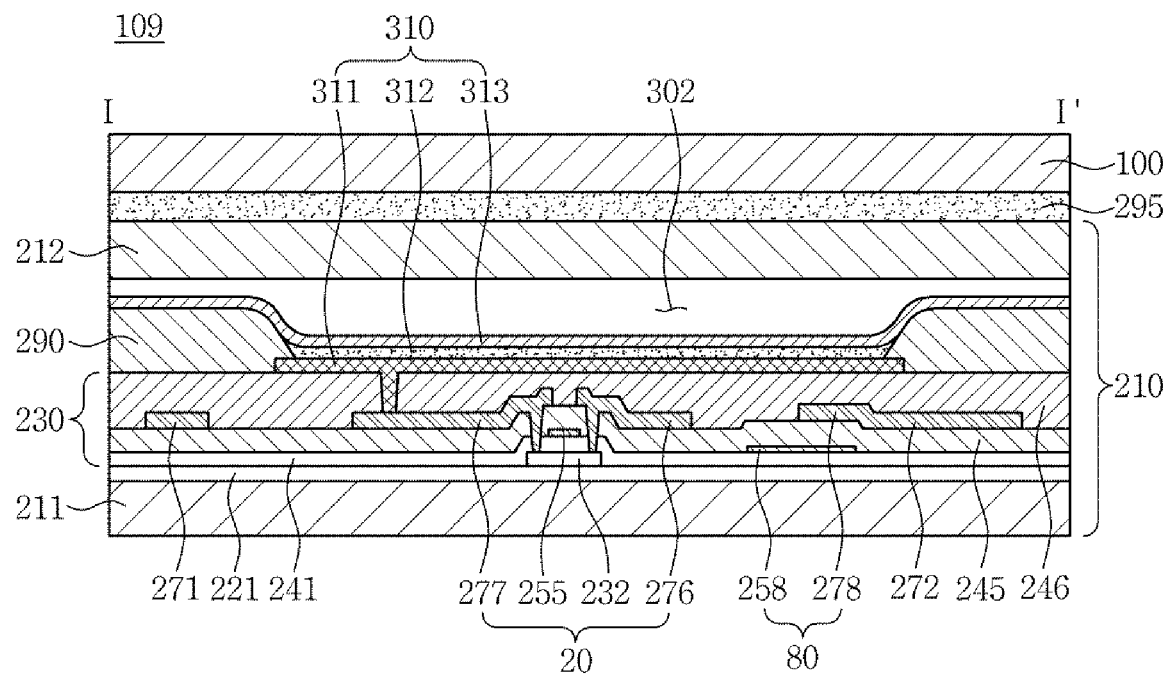
FIG. 13 is a cross-sectional view taken along the line I-I' of FIG. 12.

Hereinafter, an organic light emitting diode ("OLED") display device 109 according to a ninth exemplary embodiment is described with reference to FIGS. 12 and 13. FIG. 12 is a plan view illustrating an OLED display device 109 according to the ninth exemplary embodiment, and FIG. 13 is a cross-sectional view taken along the line I-I' of FIG. 12.

The OLED display device 109 according to the ninth exemplary embodiment includes a display panel 210 and a window 100 on the display panel 210.

The display panel 210 of the OLED display device 109 according to the ninth exemplary embodiment includes a first substrate 211, a driving circuit unit 230 and an OLED 310.

The first substrate 211 may include an insulating material such as glass, quartz, ceramic, plastic, or the like. Further, a polymer film may be utilized for the first substrate 211.

A buffer layer 221 is disposed on the first substrate 211. The buffer layer 221 may include one or more layers selected from various inorganic layers and organic layers. The buffer layer 221 may be omitted.

The driving circuit unit 230 is disposed on the buffer layer 221. The driving circuit unit 230 includes a plurality of thin film transistors ("TFTs") (e.g., a switching TFT 10 and a driving TFT 20) and drives the OLED 310. For example, the OLED 310 emits light in accordance with a driving signal received from the driving circuit unit 230 to display an image.

FIGS. 12 and 13 illustrate an active matrix-type organic light emitting diode (AMOLED) display device 109 having a 2Tr-1Cap structure. For example, the 2Tr-1Cap structure may include two TFTs, e.g., the switching TFT 10 and the driving TFT 20 and one capacitor 80 in each pixel, but exemplary embodiments are not limited thereto. For example, the OLED display device 109 may include three or more TFTs and two or more capacitors in each pixel and may further include additional wirings. Herein, the term "pixel" refers to a smallest unit for displaying an image and the OLED display device 109 displays an image using a plurality of pixels.

Each pixel PX includes the switching TFT 10, the driving TFT 20, the capacitor 80 and the OLED 310. In addition, a gate line 251 extending along one direction (or a first direction) and a data line 271 and a common power line 272 insulated from and intersecting the gate line 251 are also provided at the driving circuit unit 230. Each pixel PX may be defined by the gate line 251, the data line 271 and the common power line 272 as a boundary, but exemplary embodiments are not limited thereto. For example, the pixels PX may be defined by a pixel defining layer and/or a black matrix.

The OLED 310 includes a first electrode 311, a light emitting layer 312 on the first electrode 311 and a second electrode 313 on the light emitting layer 312. The light emitting layer 312 includes a low molecular organic material or a high molecular organic material. Holes and electrons are injected into the light emitting layer 312 from the first electrode 311 and the second electrode 313, respectively, and combined therein to form an exciton. The OLED 310 emits light when the exciton falls from an excited state to a ground state.

The capacitor 80 includes a pair of capacitor plates (i.e., capacitor plates 258 and 278), having an insulating interlayer 245 interposed therebetween. In some embodiments, the insulating interlayer 245 may be a dielectric element. A capacitance of the capacitor 80 is determined by electric charges accumulated in the capacitor 80 and a voltage across the pair of capacitor plates (i.e., capacitor plates 258 and 278).

The switching TFT 10 includes a switching semiconductor layer 231, a switching gate electrode 252, a switching source electrode 273 and a switching drain electrode 274. The driving TFT 20 includes a driving semiconductor layer 232, a driving gate electrode 255, a driving source electrode 276 and a driving drain electrode 277. A gate insulating layer 241 is further provided to insulate the switching semiconductor layer 231 and the switching gate electrode 252 and to insulate the driving semiconductor layer 232 and the driving gate electrode 255.

The switching TFT 10 may function as a switching element which selects a pixel to perform light emission. The switching gate electrode 252 is connected to the gate line 251 and the switching source electrode 273 is connected to the data line 271. The switching drain electrode 274 is connected to one of the capacitor plates, e.g., the capacitor plate 258, and is spaced apart from the switching source electrode 273.

The driving TFT 20 applies a driving power, which allows the light emitting layer 312 of the OLED 310 in a selected pixel to emit light, to the first electrode 311 which is a pixel electrode. The driving gate electrode 255 is connected to the capacitor plate 258 that is connected to the switching drain electrode 274. Each of the driving source electrode 276 and the other of the capacitor plates, e.g., the capacitor plate 278, is connected to the common power line 272. The driving drain electrode 277 is connected to the first electrode 311 of the OLED 310 through a contact hole (or a contact opening) defined in a planarization layer 246.

With the above-described structure, the switching TFT 10 is driven based on a gate voltage applied to the gate line 251 and serves to transmit a data voltage applied to the data line 271 to the driving TFT 20. A voltage equivalent to a difference between a common voltage applied to the driving TFT 20 from the common power line 272 and the data voltage transmitted by (or from) the switching TFT 10 is stored in the capacitor 80 and a current corresponding to the voltage stored in the capacitor 80 flows to the OLED 310 through the driving TFT 20 such that the OLED 310 may emit light.

According to the ninth exemplary embodiment, the first electrode 311 is a reflective electrode and the second electrode 313 is a semi-transmissive electrode. Accordingly, a light generated in the light emitting layer 312 is emitted through the second electrode 313.

For example, the first electrode 311 may include a reflective layer including one or more metals selected from: magnesium (Mg), silver (Ag), gold (Au), calcium (Ca), lithium (Li), chromium (Cr), copper (Cu) and aluminum (Al), and a transparent conductive layer on the reflective layer. The transparent conductive layer may include a transparent conductive oxide (TCO). Examples of the TCO may include: indium tin oxide (ITO), indium zinc oxide (IZO), zinc oxide (ZnO), aluminum zinc oxide (AZO), and/or indium oxide ($In_2O_3$).

In addition, the first electrode 311 may have a triple-layer structure in which a transparent conductive layer, a reflective layer and a transparent conductive layer are sequentially stacked.

The second electrode 313 may include a semi-transmissive layer including one or more metals selected from: magnesium (Mg), silver (Ag), gold (Au), calcium (Ca), lithium (Li), chromium (Cr), copper (Cu) and aluminum (Al).

In some embodiments, at least one of a hole injection layer (HIL) and a hole transport layer (HTL) may further be provided between the first electrode 311 and the light emitting layer 312 and at least one of an electron transport layer (ETL) and an electron injection layer (EIL) may further be provided between the light emitting layer 312 and the second electrode 313. The light emitting layer 312, the hole injection layer (HIL), the hole transport layer (HTL), the electron transport layer (ETL) and the electron injection layer (EIL) may include an organic material and thus may be referred to as an organic layer.

A pixel defining layer 290 is disposed on the driving circuit unit 230 and has an opening. The first electrode 311, the light emitting layer 312 and the second electrode 313 are sequentially stacked in the opening of the pixel defining layer 290. The second electrode 313 is formed on the pixel defining layer 290 as well as the light emitting layer 312. In an exemplary embodiment, the hole injection layer (HIL), the hole transport layer (HTL), the electron transport layer (ETL) and the electron injection layer (EIL) may also be disposed between the pixel defining layer 290 and the second electrode 313. The OLED 310 generates light from the light emitting layer 312 positioned in the opening of the pixel defining layer 290. For example, the pixel defining layer 290 may define a light emitting area.

A capping layer may be provided on the second electrode 313, which protects the OLED 310 from an external environment.

A second substrate 212 is disposed on the second electrode 313. The second substrate 212 seals the OLED 310 together with the first substrate 211. The second substrate 212, similar to the first substrate 211, may include an insulating material such as glass, quartz, ceramic, plastic, or the like.

A buffer material 302 may be disposed between the OLED 310 and the second substrate 212. The buffer material 302 protects the OLED 310 and the like against an impact that may be externally applied to the OLED display device 109. The buffer material 302 may include at least one of, for example, a urethane-based resin, an epoxy-based resin, an acrylic resin, and silicone that is an inorganic sealant.

An adhesive layer 295 is disposed on the display panel 210 and the window 100 is disposed on the adhesive layer 295. One of the plastic substrates 101, 102, 103, 104, 105, 106, 107 and 108 according to the first, second, third, fourth, fifth, sixth, seventh and eighth exemplary embodiments may be utilized as the window 100. The first organic-inorganic hybrid layer 121 of the plastic substrates 101, 102, 103, 104, 105, 106, 107 and 108 according to the first, second, third, fourth, fifth, sixth, seventh and eighth exemplary embodiments is positioned on the opposite side from the display panel 210.

Hereinafter, a tenth exemplary embodiment is described with reference to FIG. 14.

Figure 14:
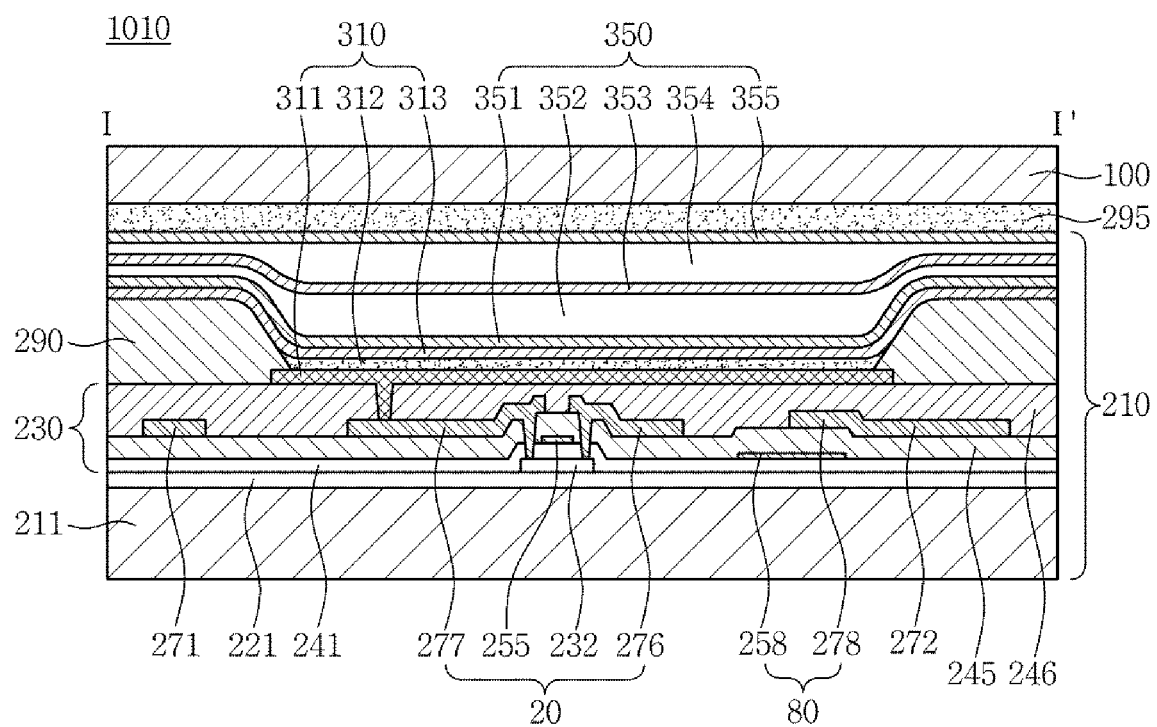
FIG. 14 is a cross-sectional view illustrating an OLED display device according to a tenth exemplary embodiment.

FIG. 14 is a cross-sectional view illustrating an OLED display device 1010 according to a tenth exemplary embodiment. The OLED display device 1010 according to the tenth exemplary embodiment includes a thin film encapsulation layer 350 provided on the second electrode 313 to protect the OLED 310.

The thin film encapsulation layer 350 includes one or more inorganic layers and one or more organic layers, and substantially prevents outside air such as moisture or oxygen from permeating into the OLED 310, or reduces the likelihood thereof.

The thin film encapsulation layer 350 may have a structure in which the inorganic layers 351, 353 and 355 and the organic layers 352 and 354 are alternately stacked. In FIG. 14, the thin film encapsulation layer 350 includes three inorganic layers (i.e., the inorganic layers 351, 353 and 355) and two organic layers (i.e., the organic layers 352 and 354), but the structure of the thin film encapsulation layer 350 according to the tenth exemplary embodiment is not limited thereto.

Each of the inorganic layers 351, 353 and 355 may include one or more inorganic materials, such as $Al_2O_3$, $TiO_2$, ZrO, $SiO_2$, AlON, AlN, SiON, $Si_3N_4$, ZnO and $Ta_2O_5$. The inorganic layers 351, 353 and 355 may be formed through methods such as a chemical vapor deposition (CVD) method or an atomic layer deposition (ALD) method. However, exemplary embodiments are not limited thereto and the inorganic layers 351, 353 and 355 may be formed using various methods known to those skilled in the art.

The organic layers 352 and 354 may include a polymer-based material. Examples of the polymer-based material may include, for example, an acrylic resin, an epoxy resin, polyimide and/or polyethylene. In addition, the organic layers 352 and 354 may be formed through a thermal deposition process. The thermal deposition process for forming the organic layers 352 and 354 may be performed in a temperature range that may not damage the OLED 310. However, the tenth exemplary embodiment is not limited thereto and the organic layers 352 and 354 may be formed using various methods known to those skilled in the pertinent art.

The inorganic layers 351, 353, and 355, which have a high density of thin layers, may prevent or efficiently reduce infiltration of moisture and/or oxygen. Permeation of moisture and oxygen into the OLED 310 may be largely prevented by the inorganic layers 351, 353, and 355, or the likelihood thereof may be reduced.

The organic layers 352 and 354 may also serve as a buffer layer to reduce stress among respective ones of the inorganic layers 351, 353 and 355, in addition to reducing (or preventing) moisture-infiltration. Further, because the organic layers 352 and 354 have planarization characteristics, an uppermost surface of the thin film encapsulation layer 350 may be planarized.

The thin film encapsulation layer 350 may have a relatively small thickness of about 10 μm or less. Accordingly, the OLED display device 1010 may also have a relatively small thickness.

When the thin film encapsulation layer 350 is disposed on the OLED 310, the second substrate 212 may be omitted. When the second substrate 212 is omitted, the flexible characteristics of the OLED display device 1010 are improved.

The adhesive layer 295 is disposed on the thin film encapsulation layer 350 and the window 100 is disposed on the adhesive layer 295.

Figure 15:
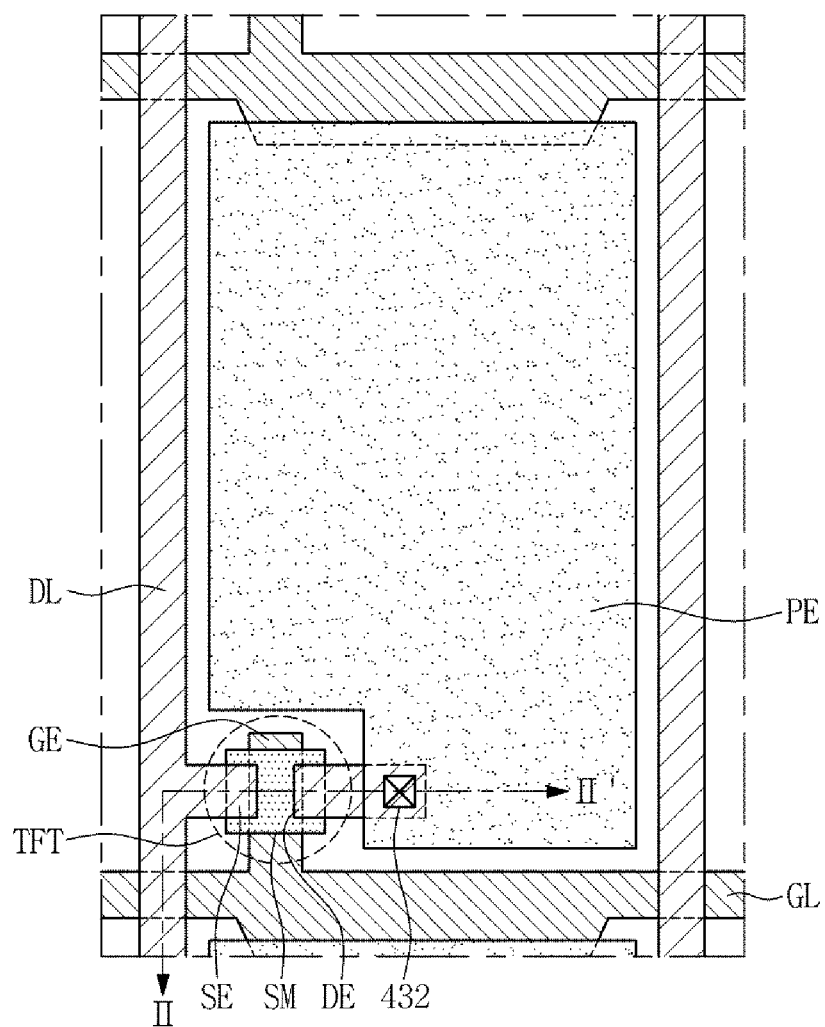
FIG. 15 is a plan view illustrating a liquid crystal display ("LCD") device according to an eleventh exemplary embodiment.
Figure 16:
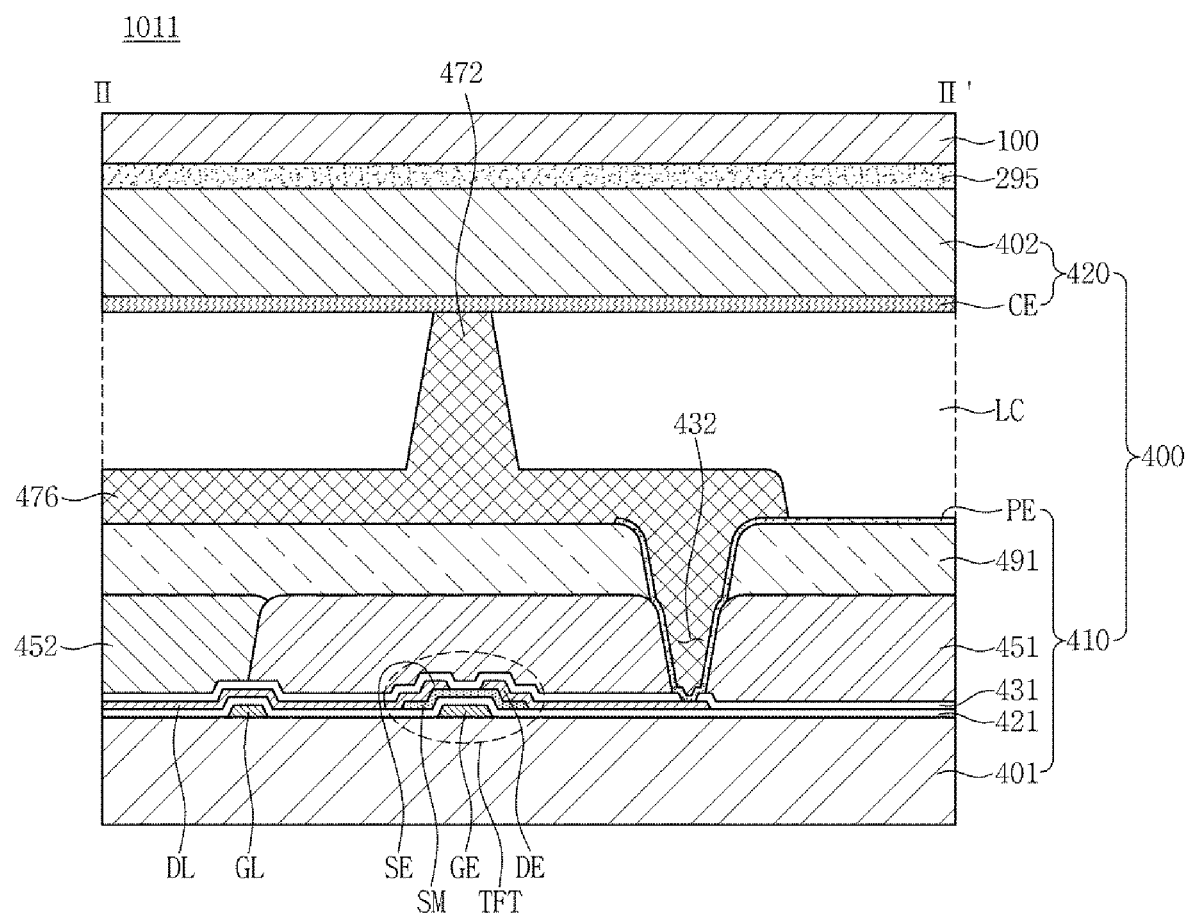
FIG. 16 is a cross-sectional view taken along the line II-II' of FIG. 15.

FIG. 15 is a plan view illustrating a liquid crystal display ("LCD") device 1011 according to an eleventh exemplary embodiment, and FIG. 16 is a cross-sectional view taken along the line II-II' of FIG. 15.

The LCD device 1011 according to the eleventh exemplary embodiment includes an LCD panel 400 and a window 100 on the LCD panel 400.

The LCD panel 400 includes a display substrate 410, an opposing substrate 420 and a liquid crystal layer LC between the display substrate 410 and the opposing substrate 420.

The display substrate 410 includes a first substrate 401 and a gate line GL, a data line DL, a thin film transistor TFT, a gate insulating layer 421, an insulating interlayer 431, a first color filter 451, a second color filter 452, a planarization layer 491, a pixel electrode PE and a light blocking portion 476 on the first substrate 401.

The gate line GL and a gate electrode GE extending from the gate line GL are disposed on the first substrate 401.

The gate insulating layer 421 is disposed on the gate line GL and the gate electrode GE. In some exemplary embodiments, the gate insulating layer 421 may be disposed over an entire surface of the first substrate 401 including the gate line GL and the gate electrode GE. The gate insulating layer 421 may include silicon nitride (SiNx), silicon oxide (SiOx), or the like. The gate insulating layer 421 may have a multilayer structure including at least two insulating layers having different physical properties.

A semiconductor layer SM is disposed on the gate insulating layer 421. The semiconductor layer SM overlaps the gate electrode GE, a source electrode SE and a drain electrode DE. The semiconductor layer SM may include amorphous silicon, polycrystalline silicon, or the like. The semiconductor layer SM may include an oxide semiconductor material. An ohmic contact layer may be disposed on the semiconductor layer SM.

The source electrode SE is disposed to partially overlap the semiconductor layer SM. The source electrode SE extends from the data line DL.

The drain electrode DE is spaced apart from the source electrode SE and partially overlaps the semiconductor layer SM. The drain electrode DE is connected to the pixel electrode PE. The drain electrode DE and the source electrode SE may be formed concurrently (or substantially simultaneously) in a substantially same process.

The thin film transistor TFT is defined by the gate electrode GE, the semiconductor layer SM, the source electrode SE and the drain electrode DE.

A channel area of the thin film transistor TFT is positioned at a portion of the semiconductor layer SM between the source electrode SE and the drain electrode DE.

The data line DL is disposed on the gate insulating layer 421 and crosses the gate line GL. The data line DL and the source electrode SE may be formed substantially simultaneously in a substantially same process.

The semiconductor layer SM may be further provided between the gate insulating layer 421 and the source electrode SE and may be further provided between the gate insulating layer 421 and the drain electrode DE. In addition, the semiconductor layer SM may be further provided between the gate insulating layer 421 and the data line DL.

The insulating interlayer 431 is disposed on the data line DL, the source electrode SE, the drain electrode DE, the semiconductor layer SM and the gate insulating layer 421. In some exemplary embodiments, the insulating interlayer 431 may be disposed over an entire surface of the first substrate 401 including the data line DL, the source electrode SE, the drain electrode DE and the gate insulating layer 421. Referring to FIGS. 15 and 16, the insulating interlayer 431 has a drain contact hole (or a drain contact opening) 432.

The insulating interlayer 431 may include an inorganic insulating material such as silicon nitride (SiNx) or silicon oxide (SiOx), or may include an organic layer. In addition, the insulating interlayer 431 may have a bilayer structure including a lower inorganic layer and an upper organic layer.

The first color filter 451 and the second color filter 452 are disposed on the insulating interlayer 431. Edges of the first and second color filters 451 and 452 may be positioned on the gate line GL, the thin film transistor TFT and the data line DL. Edges of adjacent ones of the first and second color filters 451 and 452 may overlap each other. Each of the first and second color filters 451 and 452 has an opening defined to correspond to the drain electrode DE. Each of the first and second color filters 451 and 452 may include a photosensitive organic material.

The first color filter 451 and the second color filter 452 have different colors and may each be one of a red color filter, a green color filter, a blue color filter, a cyan color filter, a magenta color filter, a yellow color filter and a white color filter.

The LCD device 1011 according to the eleventh exemplary embodiment may further include a third color filter. The third color filter has a color different from those of the first color filter 451 and the second color filter 452 and may be one of a red color filter, a green color filter, a blue color filter, a cyan color filter, a magenta color filter and a yellow color filter.

However, the eleventh exemplary embodiment is not limited thereto and the first and second color filters 451 and 452 may be disposed on a second substrate 402, for example.

The planarization layer 491 is disposed on the first and second color filters 451 and 452. In some exemplary embodiments, the planarization layer 491 may be disposed over an entire surface of the first substrate 401 including the first and second color filters 451 and 452 and the insulating interlayer 431. However, referring to FIGS. 15 and 16, the planarization layer 491 may have an opening defined to correspond to the drain contact hole 432.

The planarization layer 491 functions as a protective layer and planarizes a portion below the pixel electrode PE. The planarization layer 491 may be referred to as a protective layer. The planarization layer 491 may include an organic material, for example, a photosensitive organic material and/or a photosensitive resin composition. In some exemplary embodiments, the planarization layer 491 may be also referred to as an organic layer.

The pixel electrode PE is connected to the drain electrode DE through the drain contact hole 432. The pixel electrode PE is disposed on the planarization layer 491. A part of an edge of the pixel electrode PE may overlap the light blocking portion 476.

The light blocking portion 476 is disposed on the pixel electrode PE and the planarization layer 491. For example, the light blocking portion 476 overlaps the TFT, the gate lines GL and the data line DL to block light leakage.

As illustrated in FIG. 16, a column spacer 472 may be positioned on the light blocking portion 476. The column spacer 472 has a shape protruding from the light blocking portion 476 toward the opposing substrate 420 to a predetermined height. The column spacer 472 maintains a cell gap between the display substrate 410 and the opposing substrate 420.

The column spacer 472 and the light blocking portion 476 may be unitary (e.g., in a monolithic structure). In some exemplary embodiments, the column spacer 472 and the light blocking portion 476 may be concurrently (or substantially simultaneously) manufactured using a substantially the same material. The column spacer 472 and the light blocking portion 476 may be collectively referred to as a black column spacer (BCS).

The opposing substrate 420 includes the second substrate 402 and a common electrode CE on the second substrate 402.

The liquid crystal layer LC is disposed between the display substrate 410 and the opposing substrate 420.

An adhesive layer 295 is disposed on the LCD panel 400 including the display substrate 410, the liquid crystal layer LC and the opposing substrate 420, and the window 100 is disposed on the adhesive layer 295.

One of the plastic substrates 101, 102, 103, 104, 105, 106, 107 and 108 according to the first, second, third, fourth, fifth, sixth, seventh and eighth exemplary embodiments may be utilized as the window 100. The first organic-inorganic hybrid layer 121 of the plastic substrates 101, 102, 103, 104, 105, 106, 107 and 108 according to the first, second, third, fourth, fifth, sixth, seventh and eighth exemplary embodiments is positioned on the opposite side from the LCD panel 400.

As set forth hereinabove, according to one or more exemplary embodiments, the plastic substrate has excellent hardness and abrasion resistance. Accordingly, the plastic substrate may be utilized as a window for display devices.

While certain embodiments of the present invention have been illustrated and described, it is understood by those of ordinary skill in the art that certain modifications and changes can be made to the described embodiments without departing from the spirit and scope of the present invention as defined by the following claims, and equivalents thereof.

What is claimed is:

1. A display device comprising:
a display panel; and
a window on the display panel, the window comprising:
a plastic support member on the display panel having light transmittance and having a thickness ranging from about 400 μm to about 1000 μm; and
an organic-inorganic hybrid layer on a first side of the plastic support member, the organic-inorganic hybrid layer having a thickness ranging from about 2 μm to about 20 μm and comprising:
an organic-inorganic hybrid matrix; and
boron (B) ions implanted into the organic-inorganic hybrid matrix at a first side of the organic-inorganic hybrid layer, the first side of the organic-inorganic hybrid layer being opposite to a second side of the organic-inorganic hybrid layer on the first side of the plastic support member,
wherein a number of the boron ions per unit area is maintained in a range from $2\times10^{13}/cm^2$ to $1\times10^{14}/cm^2$ from the first side of the organic-inorganic hybrid layer to an implantation depth of the boron ions,
wherein the implantation depth of the boron ions from the first side of the organic-inorganic hybrid layer is in a range from 300 nm to 400 nm, and
wherein the ion implantation depth is a depth at a critical point of ion intensity, and ion intensity of the boron ions at the implantation depth of the boron ions is higher than ion intensity of the boron ions at the 300 nm depth from the first side of the organic-inorganic hybrid layer and an ion intensity of the boron ions at the 400 nm depth from the first side of the organic-inorganic hybrid layer.

2. The display device as claimed in claim 1, wherein the boron ions are implanted at an energy in a range from 60 keV to 80 keV.

3. The display device as claimed in claim 1, wherein the organic-inorganic hybrid matrix comprises a silicone resin and a polymer resin.

4. The display device as claimed in claim 1, wherein the plastic support member comprises at least one selected from the group consisting of: a polycarbonate (PC) film, a polyacrylic film, a polymethyl methacrylate (PMMA) film, a polyimide (PI) film, a polyethylene (PET) film, a polypropylene (PP) film, a polystyrene (PS) film, a polyamide (PA) film, a polyacetal (POM) film, a polybutylene terephthalate (PBT) film, a cellulose film and an acrylic-polycarbonate copolymer alloy film.

5. The display device as claimed in claim 1, further comprising a first organic layer between the first side of the plastic support member and the second side of the organic-inorganic hybrid layer.

6. A method of manufacturing a display device comprising a window, the method comprising:
forming a window; and
placing the window on an adhesive layer on an upper surface of a display device,
wherein the forming of the window comprises:
forming an organic-inorganic hybrid matrix on a first side of a plastic support member, the plastic support member having light transmittance and having a thickness ranging from about 400 μm to about 1000 μm, the organic-inorganic hybrid matrix having a thickness ranging from about 2 μm to about 20 μm; and
implanting boron (B) ions into a first side of the organic-inorganic hybrid matrix, the first side of the organic-inorganic hybrid matrix being opposite to a second side of the organic-inorganic hybrid matrix on the first side of the plastic support member,
wherein a number of the boron ions per unit area is maintained in a range from $2\times10^{13}/cm^2$ to $1\times10^{14}/cm^2$ from the first side of the organic-inorganic hybrid matrix to an implantation depth of the boron ions, wherein the implantation depth of the boron ions from the first side of the organic-inorganic hybrid matrix is in a range from about 300 nm to about 400 nm, and wherein the ion implantation depth is a depth at a critical point of ion intensity, and ion intensity of the boron ions at the implantation depth of the boron ions is higher than ion intensity of the boron ions at the 300 nm depth from the first side of the organic-inorganic hybrid layer and an ion intensity of the boron ions at the 400 nm depth from the first side of the organic-inorganic hybrid layer.

7. The method as claimed in claim 6, wherein the boron ions are implanted at an energy in a range from 60 keV to 80 keV.

* * * * *